United States Patent
Deguchi et al.

(10) Patent No.: US 7,675,363 B2
(45) Date of Patent: Mar. 9, 2010

(54) DIFFERENTIAL AMPLIFIER CIRCUIT AND A/D CONVERTER

(75) Inventors: Kazuaki Deguchi, Tokyo (JP); Takahiro Miki, Tokyo (JP)

(73) Assignee: Renesas Technology Corp., Osaka (JP)

( * ) Notice: Subject to any disclaimer, the term of this patent is extended or adjusted under 35 U.S.C. 154(b) by 42 days.

(21) Appl. No.: 12/155,278

(22) Filed: Jun. 2, 2008

(65) Prior Publication Data

US 2008/0303592 A1    Dec. 11, 2008

(30) Foreign Application Priority Data

Jun. 8, 2007    (JP)   ............................. 2007-152173

(51) Int. Cl.
*H03F 3/45* (2006.01)
(52) U.S. Cl. ........................ 330/254; 330/258; 330/253
(58) Field of Classification Search ................. 330/254, 330/258, 253
See application file for complete search history.

(56) References Cited

U.S. PATENT DOCUMENTS

| | | | | |
|---|---|---|---|---|
| 4,999,519 A | * | 3/1991 | Kitsukawa et al. | .......... 326/110 |
| 5,210,504 A | * | 5/1993 | Yagita et al. | ................. 330/253 |
| 5,412,315 A | * | 5/1995 | Tsuda | ...................... 324/158.1 |
| 5,742,551 A | * | 4/1998 | Yukutake et al. | ............. 365/207 |
| 5,994,939 A | * | 11/1999 | Johnson et al. | ............. 327/280 |
| 6,825,722 B2 | * | 11/2004 | Segawa | ....................... 330/254 |

OTHER PUBLICATIONS

Behzad Razavi, "Design of Analog CMOS Integrated Circuits", McGraw-Hill, International Edition 2001, pp. 100-134.

* cited by examiner

*Primary Examiner*—Patricia Nguyen
(74) *Attorney, Agent, or Firm*—McDermott Will & Emery, LLP

(57) ABSTRACT

PMOS transistors are interposed parallel to each other between a node, which is a first output part, and a power supply; and PMOS transistors are interposed in parallel to each other between a node, which is a second output part, and the power supply. Output voltages in time of a balanced state in which an input potential difference between an input voltage and a reference voltage is "0" are both set to a reference output common voltage by a replica circuit and a comparator. The reference output common voltage of the replica circuit is set so that the potential difference between the power supply voltage and the output common voltage becomes a value lower than a threshold voltage of the diode connected PMOS transistors.

14 Claims, 12 Drawing Sheets

F I G . 1
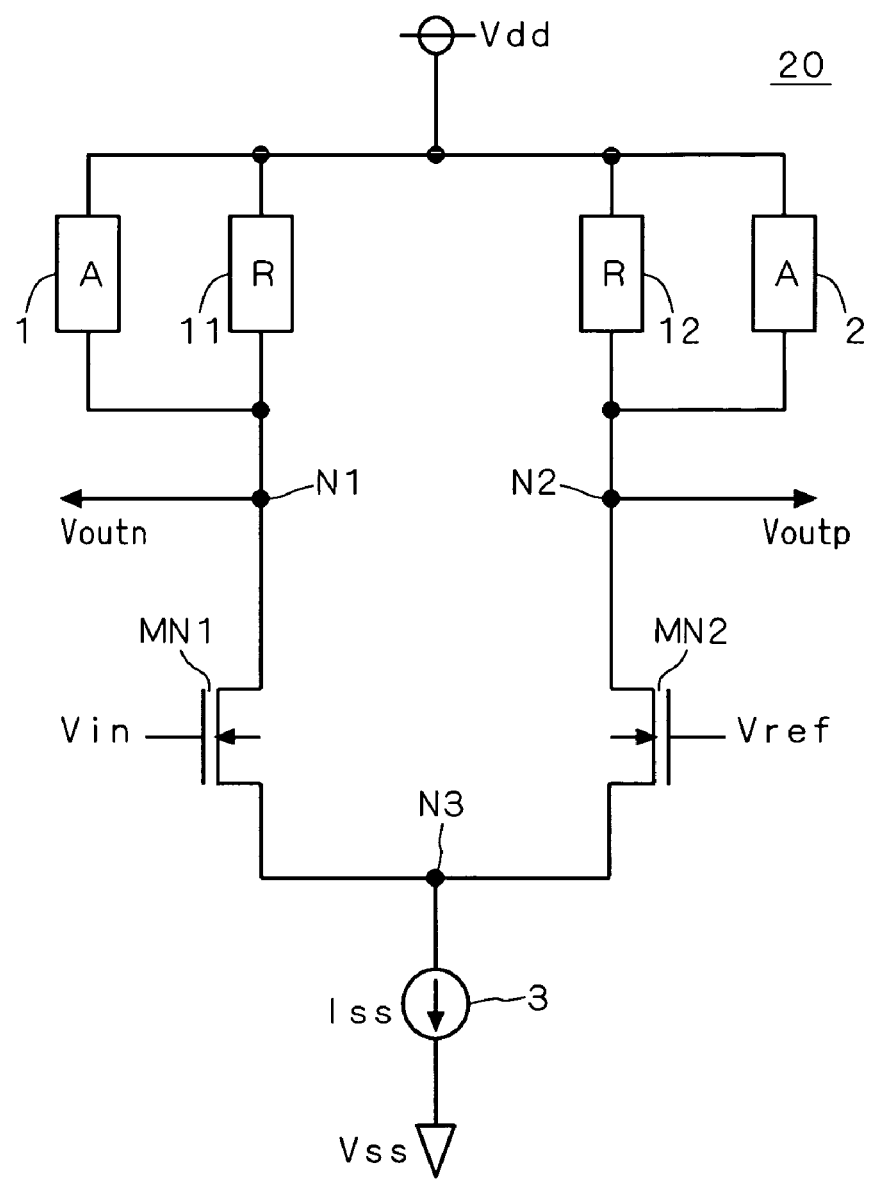

F I G . 4
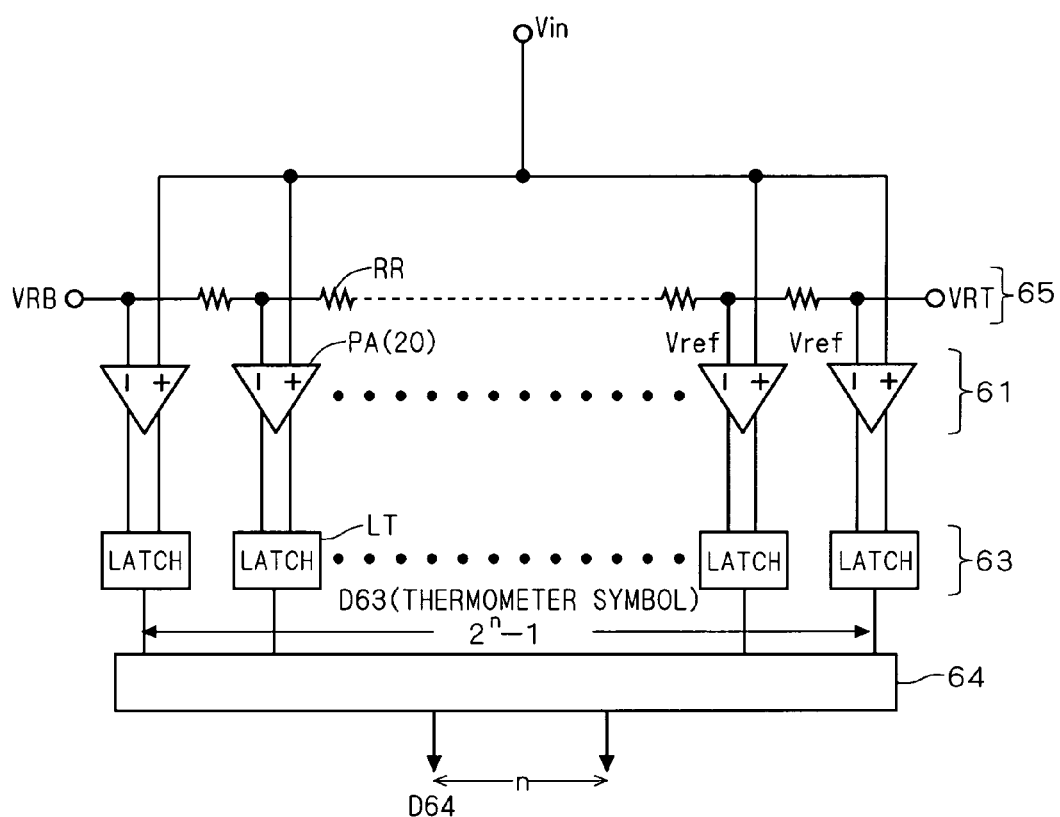

F I G . 5
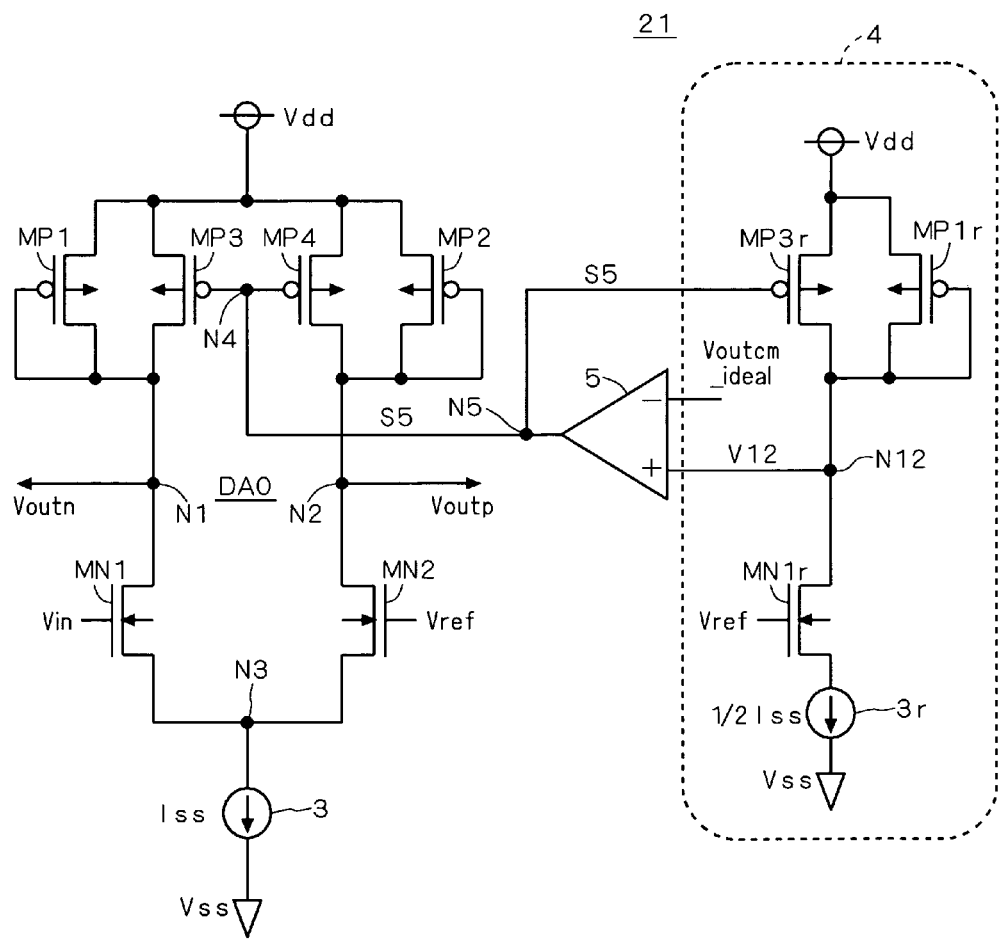

FIG. 11

DIFFERENTIAL AMPLIFIER CIRCUIT AND A/D CONVERTER

BACKGROUND OF THE INVENTION

1. Field of the Invention

The present invention relates to a differential amplifier circuit configuring a comparator, which is an element circuit of an A/D converter, and an A/D converter including the differential amplifier circuit.

2. Description of the Background Art

In the read channel of ODD (Optical Disc Drive) such as HDD (Hard Disc Drive) and DVD (Digital Versatile Disc), that is, in a system of reading signals recorded on the disc, an A/D converter for converting an analog signal to a digital signal is essential when performing signal processing (demodulation) in a digital signal process. In the HDD, the A/D converter of ultra high speed exceeding 1 GS/S is necessary in recent years with higher speed of reading speed and enhancement in recording density.

In a differential amplifier (differential amplifier stage) having a relatively high power supply voltage Vdd as an operation power supply of the prior art, a transistor element having the gate and the drain of the transistor connected (hereinafter referred to as "diode connection") is widely used as a load. The diode connected transistor load exhibits a clamp effect of preventing the output of the differential amplifier stage from spreading in excess in time of large amplitude signal input.

In the speed performance of the comparator, whether a correct determination can be made in a behavior (hereinafter referred to as "overdrive recovery") in the input condition in which a small input is provided from a state in which the output is largely spread is an important feature. The clamp effect of the diode connected transistor helps to increase the speed of the overdrive recovery.

FIG. 13 is a circuit diagram showing a configuration of a conventional differential amplifier. A differential amplifier 30 shown in FIG. 13 is disclosed in McGRAW HILL INTERNATIONAL EDITION Electrical Engineering Series "Design of Analog CMOS Integrated Circuits" page 100-134. As shown in the figure, the differential amplifier 30 includes a pair of differential pair transistors (NMOS transistor MN31 and MN32). A constant current source 31 is arranged between a node N3, which is a common terminal of the sources NMOS transistors MN31 and MN32, and a ground potential Vss.

A diode connected PMOS transistor MP31 is interposed between a node N1, which is a drain of the NMOS transistor MN31, and a power supply Vdd, and a diode connected PMOS transistor MP32 is interposed between a node N2, which is a drain of the NMOS transistor MN32, and the power supply Vdd. That is, the sources of the PMOS transistors MP31 and MP32 receive the power supply voltage Vdd, and the gates and the drains are connected to the node N1 and the node N2.

An input voltage Vin is provided to the gate of the NMOS transistor MN31, and a reference voltage Vref is provided to the gate of the NMOS transistor 32.

In such configuration, an input potential difference VinD, which is the potential difference between the input voltage Vin and the reference voltage Vref provided to the respective gates of the NMOS transistors MN31 and MN32 forming a differential pair, is amplified, an output voltage Voutn is obtained from the node N1, and an output voltage Voutp is obtained from the node N2. An output voltage Vout (=Voutp−Voutn), which is a potential difference between the output voltage Voutp and the output voltage Voutn, becomes the potential difference obtained by amplifying the potential difference between the input voltage Vin and the reference voltage Vref.

Consider a gain (DC gain) in time of small amplitude signal input in which the amplitude of the input voltage Vin of the differential amplifier 30 shown in FIG. 13 is sufficiently small. In the differential amplifier 30, the gain is expressed with the following equation (1) by a transconductance Gmn of the NMOS transistors MN1 and MN2 and a resistance component (hereinafter referred to as "output resistance Rout") of the PMOS transistors MP31 and MP32 connected to one of the nodes N1 and N2 which are the output terminals.

$$Vout/Vin = Gmn \times Rout \tag{1}$$

The output resistance Rout differs depending on the structure of the load of the differential amplifier stage. The diode connected PMOS transistors MP31 and MP32 are used as load elements in the differential amplifier 30 described above. Therefore, in the differential amplifier 30, the output resistance Rout in time of small amplitude signal input is approximately expressed as an inverse number 1/Gmp of the transconductance Gmp of the PMOS transistors MP31 and MP32 assuming the drain-source resistance (hereinafter referred to as "Rds") of the respective PMOS transistors MP31 and MP32 can be ignored.

At the time of large amplitude signal input including the amplitude input of the input potential difference VinD exceeding the small amplitude signal input, the diode connected PMOS transistors MP31 and MP32 are strongly turned ON by the large amplitude signal input, whereby the output resistance Rout lowers, the amplification degree of the differential amplifier 30 lowers, and the output voltage Vout is prevented from becoming too large, thereby helping increase the speed of the overdrive recovery.

In the differential amplifier 30 shown in FIG. 13, the output common voltage (hereinafter referred to as "Voutcm") is determined by the gate-source voltage Vgs of the diode connected PMOS transistors MP31 and MP32. The output common voltage Voutcm refers to the output voltage Voutn and the output voltage Voutp (=Voutn) that appear on the node N1 and the node N2 in time of in-phase input in which the input voltage Vin and the reference voltage Vref are equal (input potential difference VinD=0). The output common voltage Voutcm in the differential amplifier 30 is expressed with the following equation (2) where "Vtp" is the threshold voltage of the PMOS transistors MP31 and MP32, and "Veffp" is the overdrive voltage.

$$Voutcmn = Vdd - (|Vtp| + |Veffp|) \tag{2}$$

If the output common voltage Voutcm is limited by the threshold voltage Vtp of the PMOS transistors MP31 and MP32, and a low voltage needs to be used for the power supply voltage Vdd, the output common voltage Voutcm also takes a low value from equation (2). As a result, the problem arises that the drain-source voltage Vds of the NMOS transistors MN31 and MN32 forming a differential pair becomes below the overdrive voltage Veff and deviates from a saturated region, whereby the speed performance of the differential amplifier stage may degrade.

Thus, if the occupying percentage of the overdrive voltage Veff of the NMOS transistors MN31 and MN32 forming a differential pair with respect to the power supply voltage Vdd becomes large, the DC bias condition imposed on the saturated region operation of the NMOS transistors MN31 and MN32 becomes stricter.

That is, if the diode connected transistor is used as a load under a situation where the power supply voltage Vdd is relatively low, the occupying percentage of the threshold voltage Vtp of the PMOS transistors MP31 and MP32 with respect to the power supply voltage Vdd also becomes large. Thus, the output common voltage Voutcm becomes too low (or too high (if differential pair is configured by P-channel transistors)), and a bias condition in which the drain-source voltage Vds of one of the NMOS transistors MN31 and MN32 becomes below the overdrive voltage Veff is obtained. As a result, it deviates from the saturated region operation of the NMOS transistors MN31 and MN32, and the possibility of causing significant degradation of the speed performance becomes higher.

SUMMARY OF THE INVENTION

The present invention aims to provide a differential amplifier circuit that prevents degradation of performance and that can be overdrive recovered even if a power supply voltage is relatively small, and an A/D converter including the differential amplifier circuit.

According to the differential amplifier circuit of the present invention, first and second load transistors configuring amplification degree adjustment units are arranged in parallel with respect to third and fourth load transistors.

The output common voltage control unit outputs a control signal to the respective control electrodes of the third and the fourth load transistors so that potentials of the first and the second output parts from which a differential output is obtained becomes a reference output common voltage set in advance in time of in-phase input of the one input signal and the other input signal input to the respective control electrodes of the one and the other differential transistors. The reference output common voltage is set to satisfy a reference condition in which the first and the second load transistors are turned OFF in time of the in-phase input.

According to the present invention, an amplification operation of a relatively large gain is realized by a first operation in which the reference output common voltage is set while satisfying the reference condition, and the first and the second load transistors are both turned OFF in time of small amplitude signal input. As a result, the differential amplifier circuit of the present embodiment can be operated at high speed.

The differential amplifier circuit of the present invention exhibits the clamp effect to suppress the differential output from becoming too large by a second operation in which one of the first or the second load transistor is turned ON in time of large amplitude signal input. As a result, the differential amplifier circuit of the present embodiment can be operated at high speed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is an explanatory view showing a schematic configuration of a differential amplifier circuit serving as a principle of the present invention;

FIG. 4 is an explanatory view showing a configuration example of an A/D converter using the differential amplifier circuit shown in FIG. 1;

FIG. 5 is an explanatory view showing a configuration of a differential amplifier circuit according to a first embodiment of the present invention;

FIG. 11 is an explanatory view showing a schematic configuration of a differential amplifier circuit according to a seventh embodiment of the present invention;

DESCRIPTION OF THE PREFERRED EMBODIMENTS

Principle of Invention (Configuration)

Figure 2:
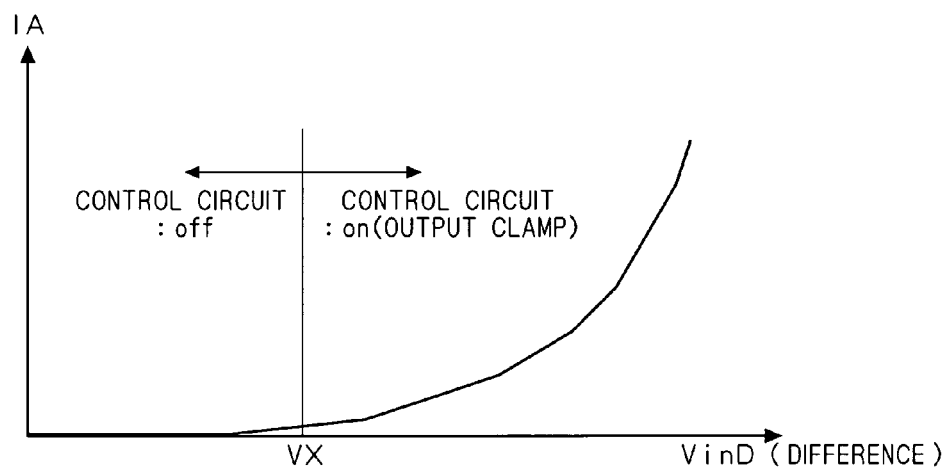
FIG. 2 is a graph showing a relationship between an input voltage and a control circuit current of the differential amplifier circuit of FIG. 1.

FIG. 1 is an explanatory view showing a schematic configuration of a differential amplifier circuit serving as a principle of the present invention. As shown in the figure, a differential amplifier circuit 20 includes a pair of differential pair transistors (NMOS transistors MN1 and MN2). A constant current source 3 serving as a differential operation constant current source is arranged between a node N3 or a common terminal of the sources of the NMOS transistors MN1 and MN2, which are one or the other differential transistors, and a ground potential Vss (second power supply). The constant current source 3 supplies a constant current Iss between the node N3 and the ground potential Vss.

An amplification degree adjustment unit 1 and a load element 11 are interposed in parallel to each other between a node N1 (first output part) which is the drain of the NMOS transistor MN1 and a power supply Vdd (first power supply), and an amplification degree adjustment unit 2 and a load element 12 are interposed in parallel to each other between a node N2 (second output part) which is the drain of the NMOS transistor MN2 and the power supply Vdd. That is, the amplification degree adjustment units 1 and 2 are arranged in correspondence to the load elements 11 and 12.

The amplification degree adjustment units 1 and 2 are turned OFF when the potential difference (inter-terminal voltage) of both ends of the load elements 11 and 12 which are first and second loads is smaller than a threshold voltage set in advance (both ends are in an open state), and are turned ON when the inter-terminal voltage is greater than the threshold voltage. The amplification degree adjustment units 1 and 2 act so that the inter-terminal voltage does not spread in excess in time of ON state, that is, so that the amplification degree of the differential amplifier circuit 20 becomes lower in time of OFF state.

The threshold voltage adjusts the output common voltage Voutcm of the differential amplifier circuit 20, and is set so as to always be in the OFF state in the input state (hereinafter referred to as "input balanced state") in which the input voltage Vin and the reference voltage Vref are equal.

The output resistance Rout of the differential amplifier circuit 20 is the inter-terminal resistance of the load elements 11 and 12 assuming the drain-source resistance Rds of the NMOS transistors MN1 and MN2 can be ignored. The load elements 11 and 12 may be passive elements or active elements as long as the resistance component between the terminals can realize a desired output resistance.

The input voltage Vin (one input signal) is provided to the gate of the NMOS transistor MN1, and the reference voltage Vref (other input signal) is provided to the gate of the NMOS transistor MN2.

(Operation)

In such configuration, the input potential difference VinD between the input voltage Vin and the reference voltage Vref provided to the respective gates of the NMOS transistors MN1 and MN2 forming a differential pair is amplified, an output voltage Voutn is obtained from the node N1, and an output voltage Voutp is obtained from the node N2. The output voltage Vout (=Voutp−Voutn), which is a potential difference between the output voltage Voutp and the output voltage Voutn, becomes the potential difference obtained by amplifying the potential difference between the input voltage Vin and the reference voltage Vref.

Here, the output common voltage Voutcm of the differential amplifier circuit 20 is expressed with the following equation (3) by a current ½·Iss flowing through the load elements 11 and 12, and the output resistance Rout.

$$Voutcmn = Vdd - (½)Iss \times Rout \qquad (3)$$

The differential amplifier circuit 20 performs two types of operations described below by turning ON, OFF the amplification degree adjustment units 1 and 2.

Figure 3:
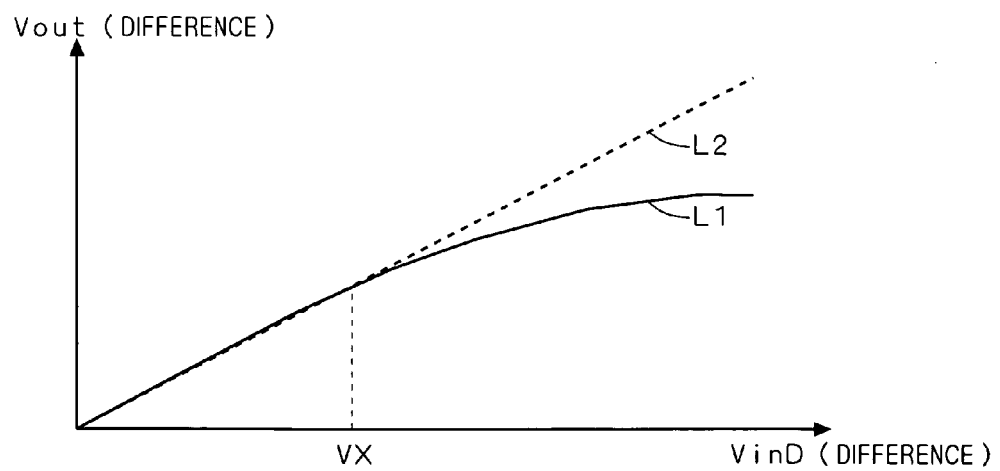
FIG. 3 is a graph showing a relationship between the input voltage and an output voltage of the differential amplifier circuit of FIG. 1.

FIG. 2 is a graph showing a relationship between the input potential difference VinD and an amplification adjustment current IA. FIG. 3 is a graph showing a relationship between the input potential difference VinD and the output voltage Vout. The amplification adjustment current IA is the current that flows through the amplification degree adjustment units 1 and 2. As described above, the output voltage Vout is the difference (Voutp−Voutn) of the output voltage Voutp and the output voltage Voutn, and the input potential difference VinD is the difference (Vin−Vref) of the input voltage Vin and the reference voltage Vref.

As shown in FIG. 2, since the amplification degree adjustment units 1 and 2 are turned OFF until the input potential difference VinD reaches a threshold voltage VX, the amplification adjustment current IA barely flows through the amplification degree adjustment units 1 and 2. That is, the differential amplifier circuit 20 is turned OFF in the input balanced state, operating equivalent of when the amplification degree adjustment units 1 and 2 are not present.

As a result, until the input potential difference VinD reaches the threshold voltage VX, an amplification adjustment present change L1 showing the relationship between the output voltage Vout with respect to the input potential difference VinD executes a first operation of obtaining a linear relationship similar to an amplification adjustment not present change L2, as shown in FIG. 3.

The first operation selects the constant current Iss and the output resistance Rout so that the amplification degree adjustment units 1 and 2 are turned OFF in the input balanced state, so that the amplification degree adjustment units 1 and 2 are always in the open state in the input balanced state (input potential difference VinD=0V), the amplification adjustment current IA will not flow, and the output voltage Voutp and the output voltage Voutn are not influenced.

As shown in FIG. 2, if the input potential difference VinD exceeds the threshold voltage VX, one of the amplification degree adjustment units 1 and 2 is turned ON, and thus the amplification adjustment current IA flows to the amplification degree adjustment unit 1 (2) in the ON state. As a result, one of the phenomenon of a phenomenon in which the combined resistance component including the amplification degree adjustment unit 1 and the load element 11 becomes lower than the resistance component for only the load element 11, and a phenomenon in which the combined resistance component including the amplification degree adjustment unit 2 and the load element 12 becomes lower than the resistance component for only the load element 12 occurs.

As shown in FIG. 3, when the input potential difference VinD exceeds the threshold voltage VX, the amplification adjustment present change L1 showing the relationship of the output voltage Vout with respect to the input potential difference VinD executes a second operation of obtaining a non-linear relationship in which the gain is lowered from the amplification adjustment not present change L2. That is, the amplification degree of the differential amplifier circuit 20 lowers when one of the amplification degree adjustment units 1 and 2 is turned ON.

In the second operation, one of the amplification degree adjustment units 1 and 2 is turned ON in time of large amplitude input in which the input potential difference VinD exceeds the threshold voltage VX. The following description is made on the assumption that the amplification degree adjustment unit 1 is turned ON. The amplification adjustment current IA starts to flow to the amplification degree adjustment unit 1, and the output voltage Voutn becomes a high potential compared to a case where the amplification degree adjustment unit 1 is not present. This is a clamp effect on the output voltage Vout which is the differential output of the differential amplifier stage in time of large amplification input.

More specifically, when the input potential difference VinD exceeds the threshold voltage VX, the potential difference between the power supply voltage Vdd and the output voltage Voutp or the potential difference between the power supply voltage Vdd and the output voltage Voutn exceeds a predetermined output threshold voltage, and thus the operation switches from the first operation to the second operation.

In order to high speed operate the comparator including the differential amplifier circuit 20, the differential output is greatly amplified and a very small input potential difference needs to be determined in time of small amplitude signal input. The differential amplifier circuit 20 realizes the amplification operation of a relatively large gain by the first operation of when both amplification degree adjustment units 1 and 2 are turned OFF.

In time of large amplitude signal input, it is desired that the differential output does not become too large for overdrive recovery. The differential amplifier circuit 20 exhibits the clamp effect for suppressing the amplification degree of the differential amplifier circuit 20 by the second operation of when one of the amplification degree adjustment units 1 and 2 is turned ON, so that high speed operation of the comparator can be achieved.

Thus, according to the present invention, when the input potential difference VinD which is the potential difference between the input voltage Vin and the reference voltage Vref exceeds the threshold voltage VX, it becomes an operation state and the amplification degree of the differential amplifier circuit 20 can be lowered by the amplification degree adjustment units 1 and 2, and thus a differential amplifier circuit is obtained that does not cause performance degradation even when the power supply voltage is relatively small and that can be overdrive recovered.

FIG. 4 is an explanatory view showing a configuration example of an A/D converter using the differential amplifier circuit 20 shown in FIG. 1. In FIG. 4, a configuration of an n-bit flash A/D converter is shown. The A/D converter shown in the figure is configured by a reference voltage setting unit 65, a pre-amplifier unit 61, a latch unit 63, and an encoder 64.

The reference voltage setting unit 65 is configured by a plurality of ($2^n-2$) resistor ladders RR connected in series between a reference voltage VRT and a reference voltage VRB. The pre-amplifier unit 61 is configured by a plurality of ($2^n-1$) pre-amplifiers PA arranged in parallel. The latch unit 33 is configured by a plurality of ($2^n-1$) latches (circuits) LT arranged in correspondence to the plurality of pre-amplifiers PA.

The pre-amplifier PA receives a commonly input analog input signal Vin at a positive input, and receives the reference voltage Vref generated by the reference voltage setting unit 65 at a negative input. The differential amplifier circuit 20 of the present invention shown in FIG. 1 is used as the pre-amplifier PA.

The reference voltage Vref obtained by the reference voltage setting unit 65 becomes one of a plurality of types of voltages by a resistance ratio of the plurality of resistor ladders RR arranged in series between the reference voltage VRT and the reference voltage VRB (<VRT).

Each pre-amplifier PA (differential amplifier circuit 20) amplifies the potential difference between the input voltage Vin obtained from the positive input and the reference voltage Vref obtained by the negative input, and outputs a positive output signal and a negative output signal to the latch LT of post stage from the positive output and the negative output.

The latch LT arranged at the post stage of the pre-amplifier PA determines "0" or "1" based on the output (positive output signal and negative output signal) of the corresponding pre-amplifier PA, and outputs the determination result ("0" or "1") as a thermometer symbol D63. The pre-amplifier PA and the latch LT configure the comparator.

Thus, the determination results output from the latches LT arranged at the post stage of the ($2^n-1$) pre-amplifiers PA are provided to the encoder 64 arranged at the next stage as the thermometer symbol D63 of ($2^n-1$) bits.

The encoder 64 converts the input to a binary signal of n bits based on the thermometer symbol D63 of ($2^n-1$) bits, and outputs the same as binary output data D64.

Therefore, if the differential amplifier circuit of the present invention is used as the pre-amplifier PA of the A/D converter, the pre-amplifier PA greatly amplifies the differential output in time of small amplitude signal input and determines a very small input potential difference, and performs a differential amplifier operation in which the differential output does not become too large and a satisfactory overdrive recovery can be exhibited in time of large amplitude signal input.

Consequently, the A/D converter including the differential amplifier circuit of the present invention can exhibit satisfactory A/D conversion characteristics even if operated at a relatively low power supply voltage.

First Embodiment

FIG. 5 is an explanatory view showing a configuration of a differential amplifier circuit according to a first embodiment of the present invention. As shown in the figure, a differential amplifier circuit 21 of the first embodiment is configured by a differential amplifier DA0, a replica circuit 4, and a comparator 5.

The differential amplifier DA0 includes a pair of differential pair transistors (NMOS transistors MN1 and MN2). A constant current source 3 is arranged between a node N3, which is a common terminal of the sources of the NMOS transistors MN1 and MN2, and the ground potential Vss.

The PMOS transistors MP1 and MP3 are interposed parallel to each other between the node N1, which is a drain of the NMOS transistor MN1, and the power supply Vdd, and PMOS transistors MP2 and MP4 are interposed parallel to each other between the node N2, which is a drain of the NMOS transistor MN2, and the power supply Vdd. Thus, the PMOS transistors MP1 to MP4 are arranged as first to fourth load transistors between the power supply voltage Vdd and the node N1 or the node N2.

The PMOS transistor MP1 is diode connected commonly at the gate and the drain, receives the power supply voltage Vdd at the source, and is connected to the node N1 at the drain. The PMOS transistor MP3 receives the power supply voltage Vdd at the source and is connected to the node N1 at the drain.

The PMOS transistor MP2 is diode connected commonly at the gate and the drain, receives the power supply voltage Vdd at the source, and is connected to the node N2 at the drain. The PMOS transistor MP4 receives the power supply voltage Vdd at the source, and is connected to the node N2 at the drain. An output signal S5 of the comparator 5 is provided to the gates of the respective PMOS transistors MP3 and MP4 as a bias voltage.

The PMOS transistors MP3 and MP4 serve as the load elements 11 and 12 of FIG. 1, and the PMOS transistors MP1 and MP2 serve as the amplification degree adjustment units 1 and 2 of FIG. 1.

The replica circuit 4 is configured by a PMOS transistor MP1r, a PMOS transistor MP3r, an NMOS transistor MN1r, and a constant current source 3r. The PMOS transistors MP1r and MP3r which are the first and second replica load transistors are formed to a size equivalent of the PMOS transistors MP1 and MP3 (all characteristics such as transistor size are the same). Similarly, the NMOS transistor MN1r which is the replica differential transistor is formed to a size equivalent of the NMOS transistor MN1. The constant current source 3r which is the replica operation constant current source supplies constant current of ½·Iss, which is half of the constant current Iss of the constant current source 3.

The PMOS transistors MP1r and MP3r are arranged in parallel between a node N12 connected to the positive input of the comparator 5 and the power supply voltage Vdd. The PMOS transistor MP1r is diode connected commonly at the gate and the drain, receives the power supply voltage Vdd at the source, and connected to the node N12 at the drain. The PMOS transistor MP3r receives the power supply voltage Vdd at the source, connected to the node N1 at the drain, and receives the output signal S5 from the comparator 5 at the gate.

The NMOS transistor MN1r and the constant current source 3r are arranged in series between the node N12 and the ground potential Vss. The drain of the NMOS transistor MN1r is connected to the node N12, and receives the reference voltage Vref at the gate. The constant current source 3r is arranged between the NMOS transistor MN1r and the ground potential Vss.

The comparator 5 has the positive input connected to the node N12 and the negative input receiving a reference output common voltage Voutcm_ideal. The output signal S5 of the comparator 5 is provided to the gates of the PMOS transistors MP3 and MP4 and to the gate of the PMOS transistor MP3r.

The output signal S5 is provided to the gate of the PMOS transistor MP3r so that the potential V12 of the node N12 matches the reference output common voltage Voutcm_ideal by the replica circuit 4 and the comparator 5.

In the replica circuit 4 and the comparator 5, the potential V12 which is the output common voltage of the replica circuit 4 is detected, and the output signal S5 that becomes the bias voltage is adjusted by the incorporated feedback loop so that the potential V12 matches the reference output common voltage Voutcm_ideal.

Therefore, the output common voltage Voutcm at the time of in-phase input of the differential amplifier DA0 is controlled so as to become the reference output common voltage Voutcm_ideal by the output signal S5 from the comparator 5 provided to the gates of the PMOS transistors MP3 and MP4. That is, the output voltage Voutp and the output voltage Voutn of the differential amplifier circuit 21 in time of the balanced state (in-phase input) of the input potential difference VinD=0 are both set to the reference output common voltage Voutcm_ideal.

In this case, the reference output common voltage Voutcm_ideal is set so that the potential difference between the power supply voltage Vdd and the output common voltage Voutcm becomes a value lower than a threshold voltage Vth of the diode connected PMOS transistors MP1 and MP2. That is, the value of the reference output common voltage Voutcm_ideal is set so as to satisfy the reference condition of {Vdd−Voutcm_ideal<Vth}.

In such configuration, the diode connected PMOS transistors MP1 and MP2 are always in the OFF state in the input balanced state and current will not flow to the PMOS transistors MP1 and MP2 by setting the reference output common voltage Voutcm_ideal that satisfies the reference condition.

Thus, in time of small amplitude signal input including the input balanced state, the PMOS transistors MP1 and MP2 barely influence the output potential, the output common voltage Voutcm of the differential amplifier DA0 is determined only by the on-resistance of the PMOS transistors MP3 and MP4 to which gates the output signal S5 is provided, and the output common voltage Voutcm becomes substantially the same value as the reference output common voltage Voutcm_ideal. Thus, the replica circuit 4 and the comparator 5 serve as an output common voltage control unit with respect to the PMOS transistors MP3 and MP4.

Consider a case in which the reference condition is generalized, where the threshold voltage of the P-type or the N-type transistor corresponding to the PMOS transistors MP1, MP2 is VT and the voltage corresponding to the power supply voltage Vdd is VC (normally power supply voltage Vdd or ground potential Vss). In this case, {|VC−Voutcm_ideal|<VT} becomes the reference condition for the reference output common voltage Voutcm_ideal in time of the balanced state of the input potential difference VinD="0". If such reference condition is satisfied, the P-type or the N-type transistor can be turned OFF in time of the balanced state in which the input potential difference VinD is "0".

If a passive element is used as a load, the output common voltage Voutcm fluctuates according to change in conditions such as temperature, power supply voltage, and the like. However, in the first embodiment, the output common voltage Voutcm can be maintained at an ideal value even if the above conditions change by performing a control by the output signal S5 of the comparator 5 based on the comparison result between the reference output voltage obtained from the node N12 of the replica circuit 4 configured equivalent to one part of the differential amplifier DA0, and the reference output common voltage Voutcm_ideal.

Furthermore, since the PMOS transistors MP1 and MP2, which are diode connected transistors, are in the OFF state in time of small amplitude signal input, the inversion layer does not form in the channel region of the PMOS transistors MP1 and MP2, the parasitic capacitance (gate-source capacity of PMOS transistors MP1 and MP2) of the output node becomes small compared to the conventional circuit, and higher speed can be expected.

In time of small amplitude signal input, the output resistance Rout of the differential amplifier DA0 becomes the drain-source resistance Rds of the PMOS transistors MP3 and MP4 assuming the drain-source resistance Rds of the NMOS transistors MN1 and MN2 can be ignored.

The ON condition of {(Vdd−Voutp(Voutn))>Vth(MP1 or MP2)} is met at one of the nodes of the node N1 or node N2, which is the output node, in time of large amplitude signal input. As a result, the transistor that satisfies the ON condition of the PMOS transistors MP1 and MP2 is turned ON. Of the node N1 and the node N2, the clamp effect is exhibited as a result of the relevant transistor being turned ON at the node on the ON state transistor side, and consequently, lowering in potential at the node is suppressed compared to a configuration in which the diode connected transistors MP1, MP2 are not arranged. Thus, the amplification degree of the differential amplifier DA0 is suppressed by the clamp effect when the PMOS transistor MP1 or MP2 is turned ON, and higher speed of the overdrive recovery can be expected.

The differential amplifier circuit 21 of the first embodiment realizes the amplification operation of a relatively large gain by the first operation of setting the reference output common voltage Voutcm_ideal while satisfying the reference condition and turning both PMOS transistors MP1 and MP2 to OFF in time of small amplitude signal input.

As a result, in the differential amplifier circuit 21, the NMOS transistors MN1 and MN2 configuring the differential amplifier stage are avoided as much as possible from falling in the linear region, and degradation in speed performance of the differential amplifier stage can be prevented, whereby the differential amplifier circuit 21 (comparator including the same) can be operated at high speed.

The differential amplifier circuit 21 of the first embodiment suppresses the differential output from becoming too large by exhibiting the clamp effect according to the second operation of turning ON one of the PMOS transistors MP1 and MP2 in time of large amplitude signal input. As a result, the differential amplifier circuit 21 can be operated at high speed.

Second Embodiment

Figure 6:
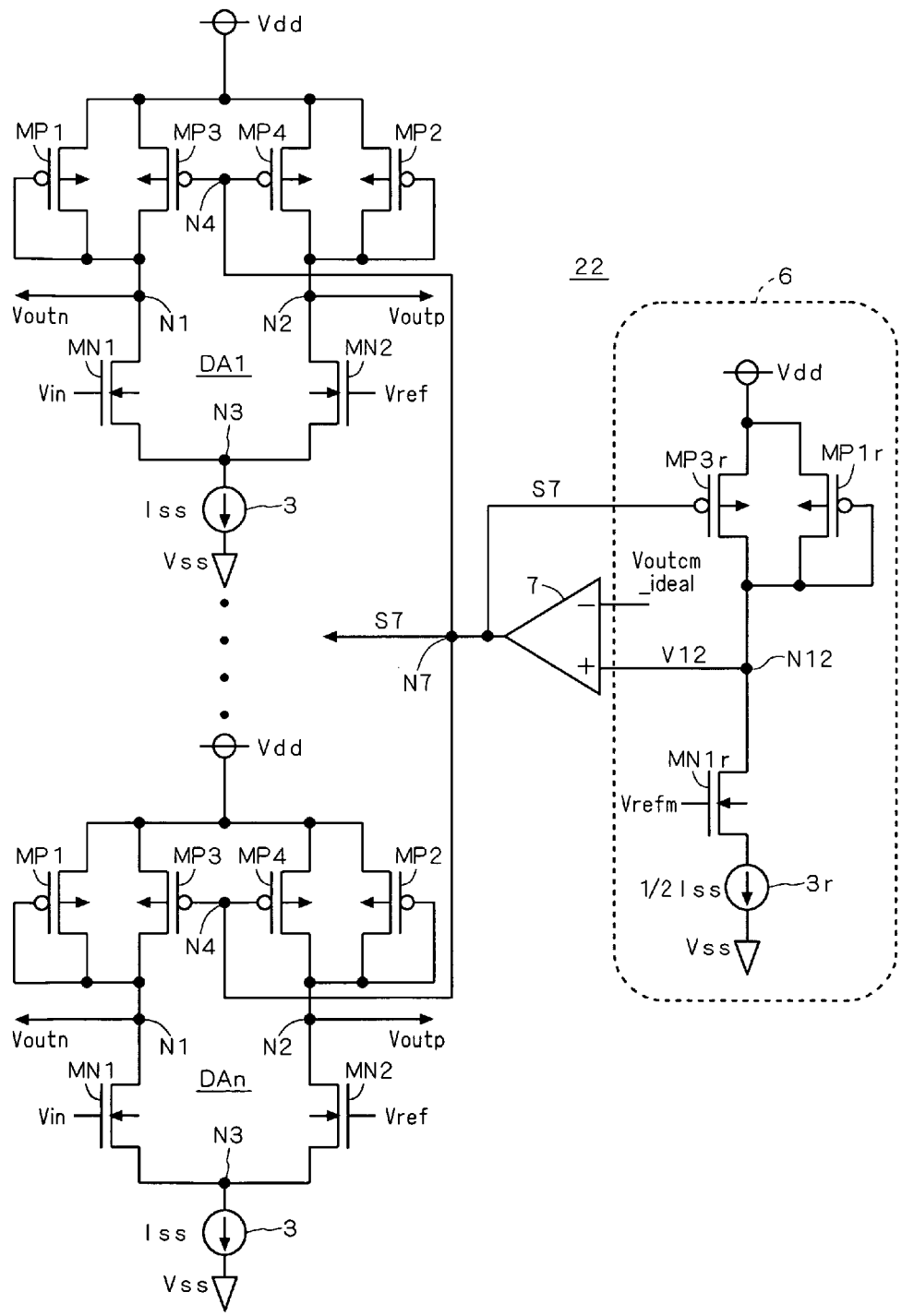
FIG. 6 is an explanatory view showing a configuration of a differential amplifier circuit according to a second embodiment of the present invention.

FIG. 6 is an explanatory view showing a configuration of a differential amplifier circuit according to a second embodiment of the present invention. As shown in the figure, a differential amplifier circuit 22 is configured by n (n≧2) differential amplifier stages DA1 to DAn, a replica circuit 6, and a comparator 7.

The differential amplifier stages DA1 to DAn each has a configuration equivalent to the differential amplifier DA0 of the first embodiment shown in FIG. 5. The reference voltage Vref input to each differential amplifier stage DA1 to DAn is the reference voltage generated by the ladder resistor etc., and is set to different values so as to become larger (smaller) in a step-wise manner over the differential amplifier stages DA1 to DAn between a minimum reference voltage VRB and a maximum reference voltage VRT.

For instance, if the differential amplifier circuit 22 is used as the pre-amplifier PA in the A/D converter shown in FIG. 4, a plurality of pre-amplifiers PA (differential amplifier circuits 22) are arranged in parallel in correspondence to a plurality of reference voltages set to different values in a step-wise manner between the maximum reference voltage VRT and the minimum reference voltage VRB by the reference voltage setting unit 65.

Therefore, a case in which the n differential amplifier stages DA1 to DAn are used as pre-amplifiers of a comparator (pre-amplifier+latch) of the flash A/D converter which receives different reference voltages is assumed. The configuration and the operation of each differential amplifier stage DA1 to DAn is the same as the differential amplifier DA0 of the first embodiment, and thus the description thereof will be omitted.

Similar to the replica circuit 4 of the first embodiment, the replica circuit 6 is configured by the PMOS transistor MP1$r$, the PMOS transistor MP3$r$, the NMOS transistor MN1$r$, and the constant current source 3$r$. The configuration and the operation thereof are the same as the replica circuit 4 of the first embodiment, and thus the description thereof will be omitted. However, a reference voltage Vrefm is supplied to the gate of the NMOS transistor MN1$r$. The reference voltage Vrefm is set to a predetermined intermediate voltage between the maximum reference voltage VRT and the minimum reference voltage VRB.

The comparator 7 has the positive input connected to the node N12 and the negative input receiving the reference output common voltage Voutcm_ideal from the replica circuit 6. The output signal S7 of the comparator 7 is provided to the gates of the PMOS transistors MP3 and MP4 of the respective differential amplifier stages DA1 to DAn and to the gate of the PMOS transistor MP3$r$.

The output signal S7 is provided to the gate of the PMOS transistor MP3$r$ so that the potential V12 of the node N12 matches the reference output common voltage Voutcm_ideal by the replica circuit 6 and the comparator 7.

Therefore, the output common voltage Voutcm of the respective differential amplifier stages DA1 to DAn is controlled to become the reference output common voltage Voutcm_ideal by the output signal S7 provided to the gates of the PMOS transistors MP3 and MP4 of each differential amplifier stage DA1 to DAn.

In the replica circuit 6 and the comparator 7, the potential V12 or the output common voltage of the replica circuit 6 is detected, and the output signal S7 that becomes the bias voltage is adjusted by the incorporated feedback loop so that the potential V12 matches the reference output common voltage Voutcm_ideal.

In this case, the reference output common voltage Voutcm_ideal is set so that the potential difference between the power supply voltage Vdd and the output common voltage Voutcm becomes a value lower than the threshold voltage Vth of the diode connected PMOS transistors MP1 and MP2 in each differential amplifier stage DA1 to DAn. That is, the value of the reference output common voltage Voutcm_ideal is set so as to satisfy the reference condition of {Vdd−Voutcm_ideal<Vth}.

In such configuration, the diode connected PMOS transistors MP1 and MP2 are in the OFF state in the input balanced state in each differential amplifier stage DA1 to DAn and current will not flow to the PMOS transistors MP1 and MP2 by setting the reference output common voltage Voutcm_ideal that satisfies the reference condition.

Thus, in time of small amplitude signal input including the input balanced state, the PMOS transistors MP1 and MP2 of each differential amplifier stage DA1 to DAn barely influence the output potential. The output common voltage Voutcm of each differential amplifier stage DA1 to DAn is determined only by the on-resistance of the PMOS transistors MP3 and MP4 to which gates the output signal S7 is provided, and the output common voltage Voutcm becomes substantially the same value as the reference output common voltage Voutcm_ideal.

Thus, the output common voltage Voutcm can be maintained at an ideal value even if various conditions change by performing the control based on the output signal S7 obtained by the replica circuit 6 and the comparator 7 equivalent to each differential amplifier stage DA1 to DAn.

In time of small amplitude signal input, the output resistance Rout of the differential amplifier stages DA1 to DAn becomes the drain-source resistance Rds of the PMOS transistors MP3 and MP4 assuming the drain-source resistance Rds of the NMOS transistors MN1 and MN2 can be ignored. It is desirable to increase the transistor size (W/L) of each differential amplifier stage DA1 to DAn or increase the transconductance so that the value of the output resistance Rout becomes small.

In time of large amplitude signal input, higher speed of the overdrive recovery of the comparator including the differential amplifier stages DA1 to DAn can be expected by the clamp effect obtained when the PMOS transistor MP1 or MP2 of each differential amplifier stage DA1 to DAn is turned ON, similar to the case of the differential amplifier DA0 of the first embodiment.

The differential amplifier circuit 22 of the second embodiment realizes the amplification operation of a relatively large gain by the first operation of turning both PMOS transistors MP1 and MP2 in each differential amplifier stage DA1 to DAn to OFF in time of small amplitude signal input. As a result, the comparator including the differential amplifier circuit 22 can be operated at high speed.

The differential amplifier circuit 22 of the second embodiment suppresses the differential output from becoming too large by exhibiting the clamp effect according to the second operation of turning ON one of the PMOS transistors MP1 and MP2 of each differential amplifier stage DA1 to DAn in time of large amplitude signal input. As a result, the comparator including the differential amplifier circuit 22 can be operated at high speed.

The differential amplifier circuit 22 of the second embodiment has the following advantages over the differential amplifier circuit 21 of the first embodiment. In the case of the differential amplifier circuit 21, one replica circuit 4 and one comparator 5 are arranged with respect to one differential amplifier DA0. In the differential amplifier circuit 22 of the second embodiment, one replica circuit 6 and one comparator 7 are arranged with respect to n differential amplifier stages DA1 to DAn.

Therefore, if n differential amplifiers (differential amplifier stages) are arranged, the differential amplifier circuit 22 of the second embodiment has an advantage of reducing the circuit scale of the comparator 5 and the replica circuit 6 by (n−1) compared to the differential amplifier circuit 21 of the first embodiment.

In the second embodiment, the output signal S7 from the comparator 7 is used as a common bias voltage based on the typical replica circuit 6 (replica circuit input with the reference voltage Vrefm) with respect to the differential amplifier stages DA1 to DAn. Thus, fluctuation of the output common voltage Voutcm among the differential amplifier stages DA1 to DAn becomes a concern. In order to suppress such fluctuation band as much as possible, the transistor size etc. is set so that the output resistance Rout becomes small as possible.

Third Embodiment

Figure 7:
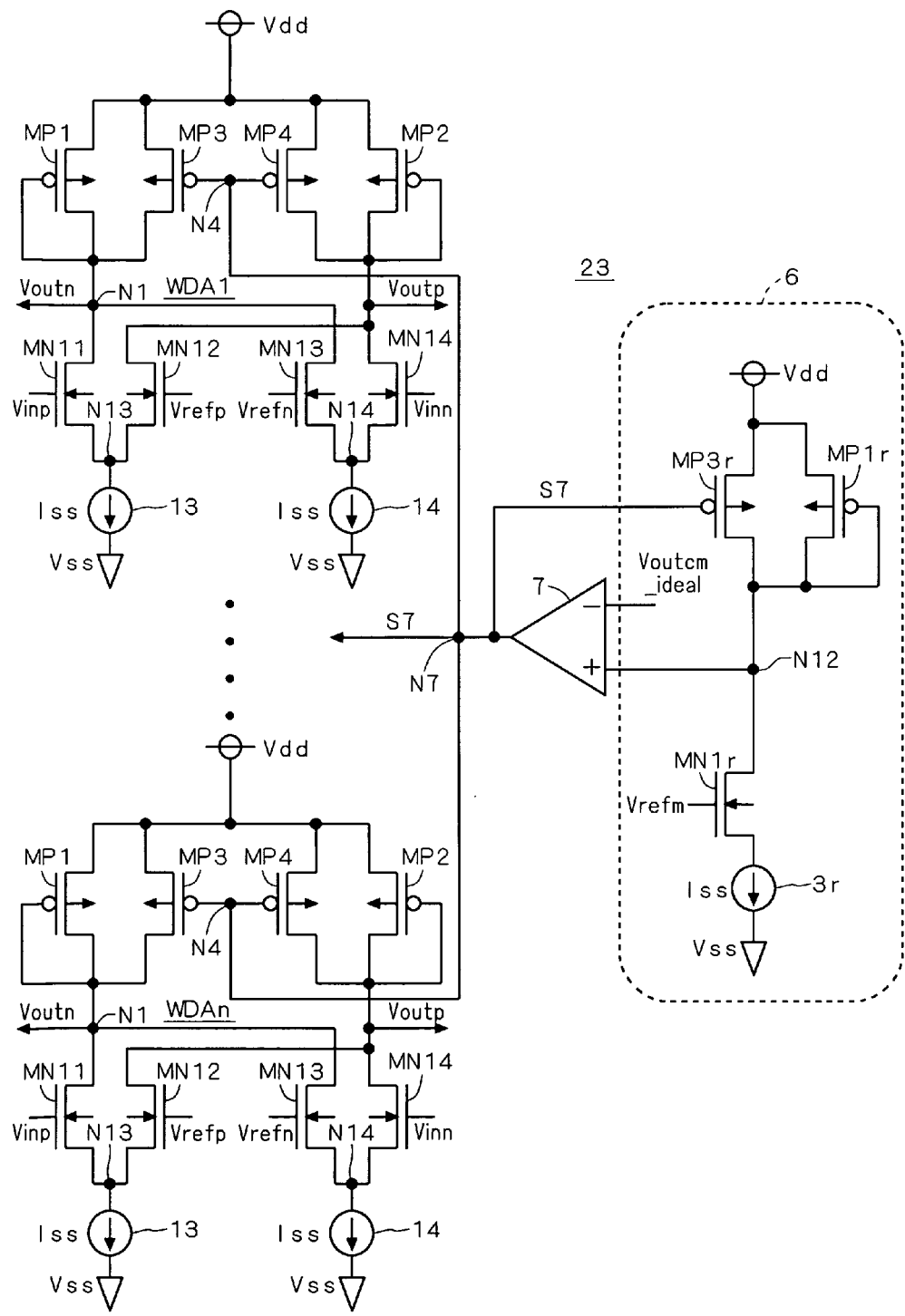
FIG. 7 is an explanatory view showing a configuration of a differential amplifier circuit according to a third embodiment of the present invention.

FIG. 7 is an explanatory view showing a configuration of a differential amplifier circuit according to a third embodiment of the present invention. As shown in the figure, a differential amplifier circuit 23 is configured by n (n≧2) differential amplifier stages WDA1 to WDAn of four-input configuration, the replica circuit 6, and the comparator 7.

As shown in the figure, the differential amplifier stages WDA1 to WDAn respectively includes two pairs of differential pair transistors (set of NMOS transistors MN11 and MN12 and set of NMOS transistors MN13 and MN14).

A constant current source 13 is arranged between a node N13, which is a common terminal of the sources of the NMOS transistors MN11 and MN12 (first one and other differential transistors), and the ground potential Vss. The constant current source 13 supplies constant current Iss.

Similar to the differential amplifier DA0 of the first embodiment (differential amplifier stages DA1 to DAn of the second embodiment), the PMOS transistors MP1 and MP3 are arranged in parallel between the node N1 which is the drain of the NMOS transistor MN11 and the power supply Vdd. Similar to the differential amplifier DA0 of the first embodiment, the PMOS transistors MP2 and MP4 are arranged in parallel between the node N2 which is the drain of the NMOS transistor MN12 and the power supply Vdd.

An input voltage Vinp (first one input signal) is provided to the gate (first positive input) of the NMOS transistor MN11, and the reference voltage Vrefp (first other input signal) is provided to the gate electrode (first negative input) of the NMOS transistor MN12.

A constant current source 14 is arranged between a node N14, which is a common terminal of the sources of the NMOS transistors MN13 and MN14 (second one and other differential transistors), and the ground potential Vss. The constant current source 14 supplies constant current Iss.

The drain of the NMOS transistor MN13 is connected to the node N1, and the drain of the NMOS transistor MN14 is connected to the node N2.

The reference voltage Vrefn (second one input signal) is provided to the gate (second positive input) of the NMOS transistor MN13, and the input voltage Vinn (second other input signal) is provided to the gate (second negative input) of the NMOS transistor MN14.

The input voltage Vinp and the input voltage Vinn have the relationships of the following equations (4) to (6). The input voltage Vinp(t) and the input voltage Vinn(t) in equation (6) are temporal change of the input voltage Vinp and the input voltage Vinn.

$$Vin = Vinp - Vinn \quad (4)$$

$$|Vinp| = |Vinn| \quad (5)$$

$$Vinp(t) + Vinn(t) = 0 \quad (6)$$

In such configuration, the potential difference between the input voltage Vinp and the reference voltage Vrefp respectively provided to the gates of the NMOS transistors MN11 and MN12 forming a differential pair, and the potential difference between the reference voltage Vrefn and the input voltage Vinn respectively provided to the gates of the NMOS transistors MN13 and MN14 forming a differential pair are amplified.

As a result, the negative output voltage Voutn is obtained from the node N1 of each differential amplifier stage WDA1 to WDAn, and the positive output voltage Voutp is obtained from the node N2.

Similar to the case of the differential amplifier stages DA1 to DAn of the second embodiment, the reference voltage Vref input to each differential amplifier stage WDA1 to WDAn is set to different values so as to become larger (smaller) in a step-wise manner over the differential amplifier stages WDA1 to WDAn. That is, the differential amplifier stages WDA1 to WDAn are used as pre-amplifiers of the comparator of the flash A/D converter which receives different reference voltages.

The configuration and the operation of the replica circuit 6 and the comparator 7 are similar to those in the second embodiment shown in FIG. 6. However, the constant current source 3r supplies constant current Iss to adapt to the differential amplifier stages WDA1 to WDAn.

Therefore, the output common voltage Voutcm of each differential amplifier stage WDA1 to WDAn is controlled to become the reference output common voltage Voutcm_ideal by the output signal S7 provided to the gates of the PMOS transistors MP3 and MP4 of each differential amplifier stage WDA1 to WDAn.

In the replica circuit 6 and the comparator 7, the potential V12 which is the output common voltage of the replica circuit 6 is detected, and the output signal S7 that becomes the bias voltage is adjusted by the incorporated feedback loop so that the potential V12 matches the reference output common voltage Voutcm_ideal.

In this case, the reference output common voltage Voutcm_ideal is set so that the potential difference between the power supply voltage Vdd and the output common voltage Voutcm becomes a value lower than the threshold voltage Vth of the PMOS transistors MP1 and MP2 in each diode connected differential amplifier stage WDA1 to WDAn. That is, the value of the reference output common voltage Voutcm_ideal is set so as to satisfy the reference condition of {Vdd−Voutcm_ideal<Vth}.

In such configuration, the diode connected PMOS transistors MP1 and MP2 are in the OFF state in the input balanced state in each differential amplifier stage WDA1 to WDAn and current will not flow to the PMOS transistors MP1 and MP2 by setting the reference output common voltage Voutcm_ideal that satisfies the reference condition.

Thus, in time of small amplitude signal input, the PMOS transistors MP1 and MP2 of each differential amplifier stage WDA1 to WDAn barely influence the output potential, the output common voltage Voutcm of each differential amplifier WDA1 to WDAn is determined only by the on-resistance of the PMOS transistors MP3 and MP4 to which gates the output signal S7 is provided, and the output common voltage Voutcm becomes substantially the same value as the reference output common voltage Voutcm_ideal.

Therefore, the differential amplifier circuit 23 of the third embodiment can maintain the output common voltage Voutcm to an ideal value even if various conditions change by performing the control based on the output signal S7 obtained by the replica circuit 6 and the comparator 7 equivalent to the differential amplifier stages WDA1 to WDAn.

In time of small amplitude signal input, the output resistance Rout of the differential amplifier stages WDA1 to WDAn becomes the drain-source resistance Rds of the PMOS transistors MP3 and MP4 assuming the drain-source resistance Rds of the NMOS transistors MN1 and MN2 can be ignored. It is desirable to increase the transistor size (W/L) of each differential amplifier stage WDA1 to WDAn or increase the transconductance so that the value of the output resistance Rout becomes small.

In time of large amplitude signal input, higher speed of the overdrive recovery of the comparator including the differential amplifier stages WDA1 to WDAn can be expected by the clamp effect of the PMOS transistor MP1 or MP2 of each differential amplifier stage WDA1 to WDAn, similar to the case of the differential amplifier stages DA1 to DAn of the second embodiment.

The differential amplifier circuit 23 of the third embodiment realizes the amplification operation of a relatively large gain by the first operation of turning both PMOS transistors MP1 and MP2 in each differential amplifier stage WDA1 to WDAn to OFF in time of small amplitude signal input. As a result, the differential amplifier circuit 23 can be operated at high speed.

The differential amplifier circuit 23 of the third embodiment suppresses the differential output from becoming too large by exhibiting the clamp effect according to the second operation of turning ON one of the PMOS transistors MP1 and MP2 of each differential amplifier stage WDA1 to WDAn in time of large amplitude signal input. As a result, the comparator including the differential amplifier circuit 23 can be operated at high speed.

Similar to the differential amplifier circuit 22 of the second embodiment, if n differential amplifiers (differential amplifier stages) are arranged, the differential amplifier circuit 23 of the third embodiment has an advantage of reducing the circuit scale of the comparator 5 and the replica circuit 6 by (n−1) compared to the differential amplifier circuit 21 of the first embodiment.

The differential amplifier circuit 23 of the third embodiment uses the differential amplifier stages WDA1 to WDAn of four-inputs, and thus the input amplitude can be extended by two times compared to the differential amplifier circuit 22 using the differential amplifier stages DA1 to DAn of two-inputs, whereby the amplification operation can be performed at satisfactory accuracy even in time of low voltage operation at which DC bias design is difficult.

The differential amplifier circuit 23 of the third embodiment has a configuration in which the differential amplifier stages WDA1 to WDAn of four-inputs are arranged in place of the differential amplifier stages DA1 to DAn of two-inputs of the differential amplifier circuit 22 of the second embodiment, but a configuration in which the differential amplifier of four-inputs is arranged in place of the differential amplifier DA0 of two-inputs of the differential amplifier circuit 21 of the first embodiment may be similarly adopted.

Fourth Embodiment

Figure 8:
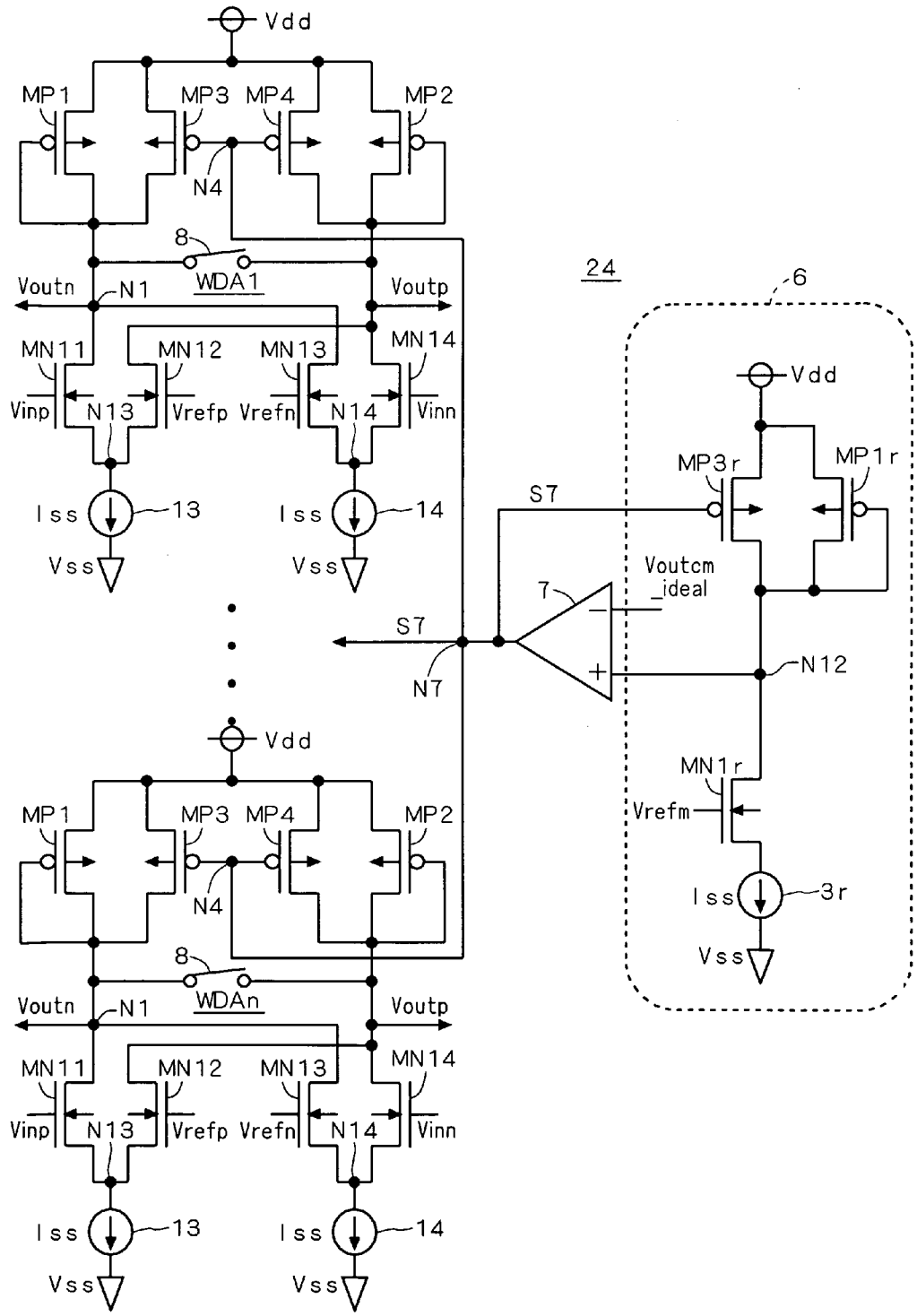
FIG. 8 is an explanatory view showing a configuration of a differential amplifier circuit according to a fourth embodiment of the present invention.

FIG. 8 is an explanatory view showing a configuration of a differential amplifier circuit according to a fourth embodiment of the present invention. As shown in the figure, a differential amplifier circuit 24 is configured by n (n≧2) differential amplifier stages WDA1 to WDAn of four-input configuration, the replica circuit 6, and the comparator 7.

As shown in the figure, the differential amplifier circuit 24 of the fourth embodiment has features in that a switch 8 is arranged between the node N1 and the node N2 in each differential amplifier stage WDA1 to WDAn.

The switch 8 is controlled by a clock signal (not shown), where the switch 8 is turned ON for a constant period at the beginning of an amplification period of each differential amplifier stage WDA1 to WDAn thereby short circuiting between the node N1 and node N2, and the switch 8 is turned OFF in the remaining period thereby having the node N1 and the node N2 in an electrically independent state. Other configurations are the same as the third embodiment shown in FIG. 7, and thus the description thereof will be omitted.

The differential amplifier circuit 24 of the fourth embodiment has advantages similar to the differential amplifier circuit 23 of the third embodiment, and also has the following advantages.

The differential amplifier circuit 24 of the fourth embodiment can short circuit the nodes N1 and N2 which are the output nodes by the switch 8 during the constant period at the beginning of the amplification period of each differential amplifier stage WDA1 to WDAn. Therefore, the recovery from a state in which the output is spread large (state in which the output voltage Vout is large) in time of large amplitude signal input can be accelerated, and higher speed of the overdrive recovery can be achieved.

The switch 8 may be arranged between the node N1 and the node N2 of the differential amplifier DA0 of the first embodiment or the differential amplifier stages DA1 to DAn of two-inputs of the second embodiment, where higher speed of the overdrive recovery is similarly achieved in such cases.

Fifth Embodiment

Figure 9:
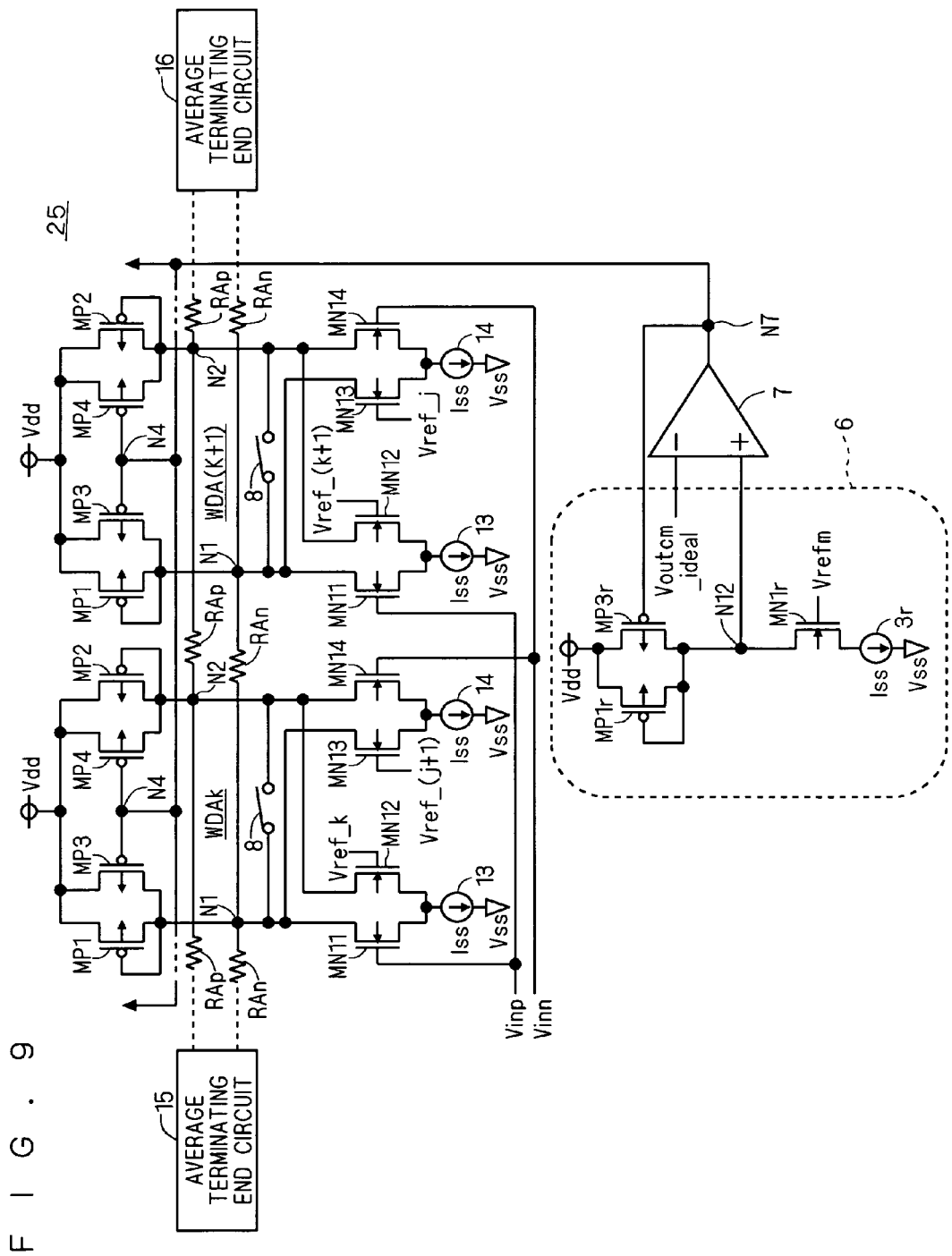
FIG. 9 is an explanatory view showing a configuration of a differential amplifier circuit according to a fifth embodiment of the present invention.

FIG. 9 is an explanatory view showing a configuration of a differential amplifier circuit according to a fifth embodiment of the present invention. As shown in the figure, a differential amplifier circuit 25 is configured by n (n≧2) differential amplifier stages WDA1 to WDAn of four-input configuration, the replica circuit 6, the comparator 7, averaging terminating end circuits 15, 16, and averaging resistors RAp and RAn.

As shown in the figure, a plurality of averaging resistors RAp and a plurality of averaging resistors RAn connected in series are arranged between the averaging terminating end circuits 15, 16.

The plurality of averaging resistors RAp is arranged at a ratio of one between the nodes N2, N2 or the positive outputs of the adjacent differential amplifier stages WDAk, WDA (k+1) (k=1 to (n−1)) of the differential amplifier stages WDA1 to WDAn.

Similarly, the plurality of averaging resistors RAn are arranged at a ratio of one between the nodes N1, N1 or the negative outputs of the adjacent differential amplifier stages WDAk, WDA (k+1) of the differential amplifier stages WDA1 to WDAn.

Using the A/D converter shown in FIG. 4 by way of example, if the pre-amplifier PA of the pre-amplifier unit 61 is configured by the differential amplifier circuit 25, the averaging resistor RAp is arranged between the positive outputs of the adjacent pre-amplifiers PA, and the averaging resistor RAn is arranged between the negative outputs of the adjacent pre-amplifiers PA.

Other configurations are the same as the fourth embodiment shown in FIG. 8, and thus the description thereof will be omitted. The differential amplifier circuit 25 of the fifth embodiment has advantages similar to the differential amplifier circuit 24 of the fourth embodiment, and also has the following advantages.

The differential amplifier circuit 25 of the fifth embodiment adopts averaging by arranging the plurality of averaging resistors RAp and the averaging resistors RAn between the averaging terminating end circuits 15, 16. Thus, the offset current caused by device mismatch is averaged, and the influence of random offset can be alleviated compared to the differential amplifier circuit 24 of the fourth embodiment.

The details on averaging are disclosed in, for example, "H. Pan and A. A. Abidi, "Spatial Filtering in Flash A/D Converters", IEEE Trans. Circuits and System II: Analog and Digital Signal Processing, pp. 424-463, August 2003".

In the fifth embodiment, a configuration in which the averaging resistors RAp, RAn and the averaging terminating end circuits 15, 16 are arranged in the configuration of the fourth embodiment shown in FIG. 9 is shown, but it should be recognized that the averaging resistors RAp, RAn and the averaging terminating end circuits 15, 16 can be similarly arranged in the configuration of the third embodiment shown in FIG. 8. Furthermore, the averaging resistors RAp, RAn and the averaging terminating end circuits 15, 16 may be arranged between the positive outputs and the negative outputs of the adjacent differential amplifier stages of the plurality of differential amplifier stages DA1 to DAn of the second embodiment shown in FIG. 7.

Sixth Embodiment

Figure 10:
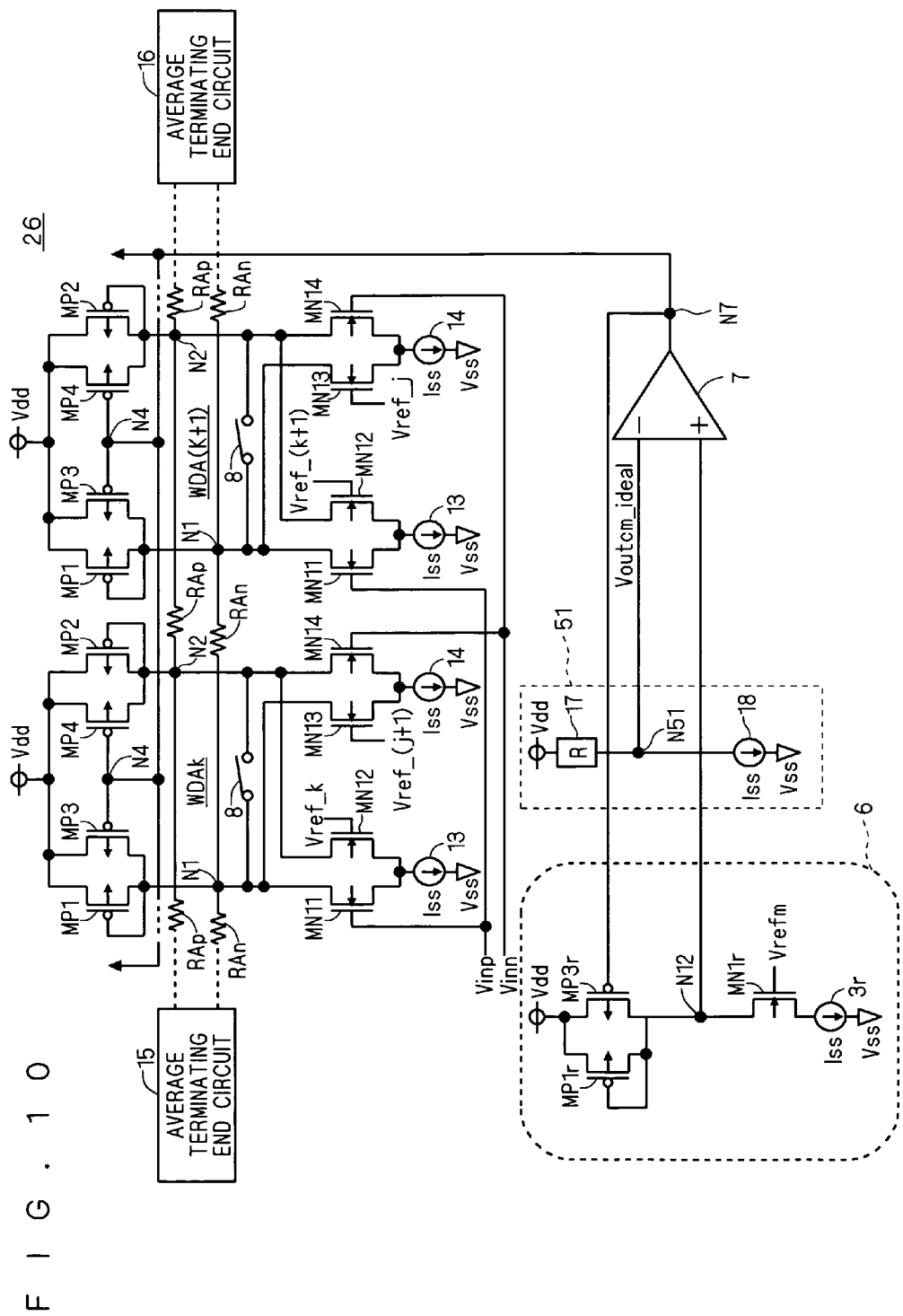
FIG. 10 is an explanatory view showing a configuration of a differential amplifier circuit according to a sixth embodiment of the present invention.

FIG. 10 is an explanatory view showing a configuration of a differential amplifier circuit according to a sixth embodiment of the present invention. As shown in the figure, a differential amplifier circuit 26 is configured by n (n≧2) differential amplifier stages WDA1 to WDAn of four-input configuration, the replica circuit 6, the comparator 7, the averaging terminating end circuits 15, 16, the averaging resistors RAp and RAn, and a reference output common voltage generation circuit 51.

As shown in the figure, the reference output common voltage generation circuit 51 is configured by a load element 17 and a constant current source 18 arranged in series between the power supply voltage Vdd and the ground potential Vss. One end of the load element 17 receives the power supply voltage Vdd, and the constant current source 18 is arranged between the other end and the ground potential Vss. The voltage obtained from a node N51 between the load element 17 and the constant current source 18 is generated as the reference output common voltage Voutcm_ideal. Other configurations are the same as those of the fifth embodiment shown in FIG. 9, and thus the description thereof will be omitted.

The differential amplifier circuit 26 of the sixth embodiment has advantages similar to the differential amplifier circuit 25 of the fifth embodiment, and also has the following advantages.

The reference output common voltage Voutcm_ideal ideally obtains a constant potential difference (Vdd−Voutcm_ideal) even if temperature, power supply voltage Vdd, and process variation occurs. In the reference output common voltage generation circuit 51 of the differential amplifier circuit 26, the potential difference (Vdd−Voutcm_ideal) can be maintained constant even if the power supply voltage Vdd fluctuates since the potential difference (Vdd−Voutcm_deal) is determined by the resistance value of the load element 17 and the constant current value of the constant current source 18.

The reference output common voltage generation circuit 51 of the sixth embodiment is realized in the configuration of the fifth embodiment shown in FIG. 9, but it should be recognized that it may also be used to generate the output common voltage Voutcm of the first embodiment to the fourth embodiment.

Seventh Embodiment

Figure 11:
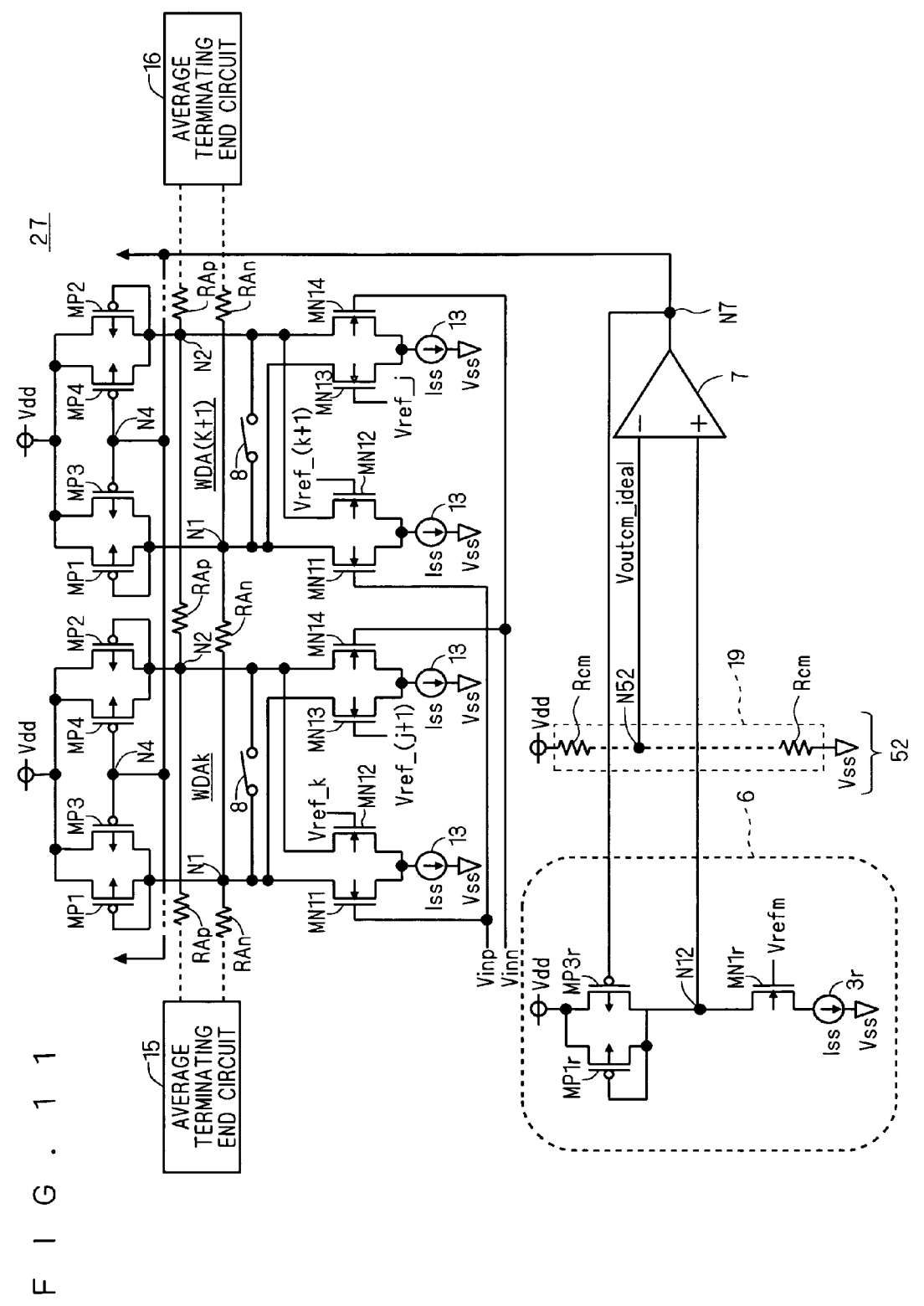

FIG. 11 is an explanatory view showing a configuration of a differential amplifier circuit according to a seventh embodiment of the present invention. As shown in the figure, a differential amplifier circuit 27 is configured by n (n≧2) differential amplifier stages WDA1 to WDAn of four-input configuration, the replica circuit 6, the comparator 7, the averaging terminating end circuits 15, 16, the averaging resistors RAp and RAn, and a reference output common voltage generation circuit 52.

As shown in the figure, the reference output common voltage generation circuit 52 has a series resistor group 19 arranged between the power supply voltage Vdd and the ground potential Vss. The series resistor group 19 is configured by a plurality of resistors Rcm connected in series, where the voltage obtained from a node N52 between the predetermined resistors Rcm, Rcm of the plurality of resistors Rcm is generated as the reference output common voltage Voutcm_ideal. Other configurations are the same as the fifth embodiment shown in FIG. 9, and thus the description thereof will be omitted.

The differential amplifier circuit 27 of the seventh embodiment has advantages similar to the differential amplifier circuit 25 of the fifth embodiment, and also has the following advantages.

The reference output common voltage Voutcm_ideal ideally obtains a constant potential difference (Vdd−Voutcm_ideal) even if temperature, power supply voltage Vdd, and process variation occurs. In the reference output common voltage generation circuit 52 of the differential amplifier circuit 27, the potential difference (Vdd−Voutcm_ideal) fluctuates when the power supply voltage Vdd fluctuates since the reference output common voltage Voutcm_ideal is generated with a resistor divided voltage by the resistors Rcm of the power supply voltage Vdd.

However, the value of the reference output common voltage Voutcm_ideal generated by the resistor divided voltage does not fluctuate even if the resistance value of each resistor Rcm fluctuates by process variation or temperature characteristics. That is, the differential amplifier circuit 27 of the seventh embodiment has an advantage of maintaining a constant potential difference (Vdd−Voutcm_ideal) even if each resistor Rcm in the reference output common voltage generation circuit 52 fluctuates. This result is effective when the amount of fluctuation of the potential difference (Vdd−Voutcm_ideal) due to fluctuation in the resistance value of the resistor Rcm exceeds the amount of fluctuation by the fluctuation of the power supply voltage Vdd.

The reference output common voltage generation circuit 52 of the seventh embodiment is realized in the configuration of the fifth embodiment shown in FIG. 9, but it should be recognized that it may also be used to generate the output common voltage Voutcm of the first embodiment to the fourth embodiment.

Eighth Embodiment

Figure 12:
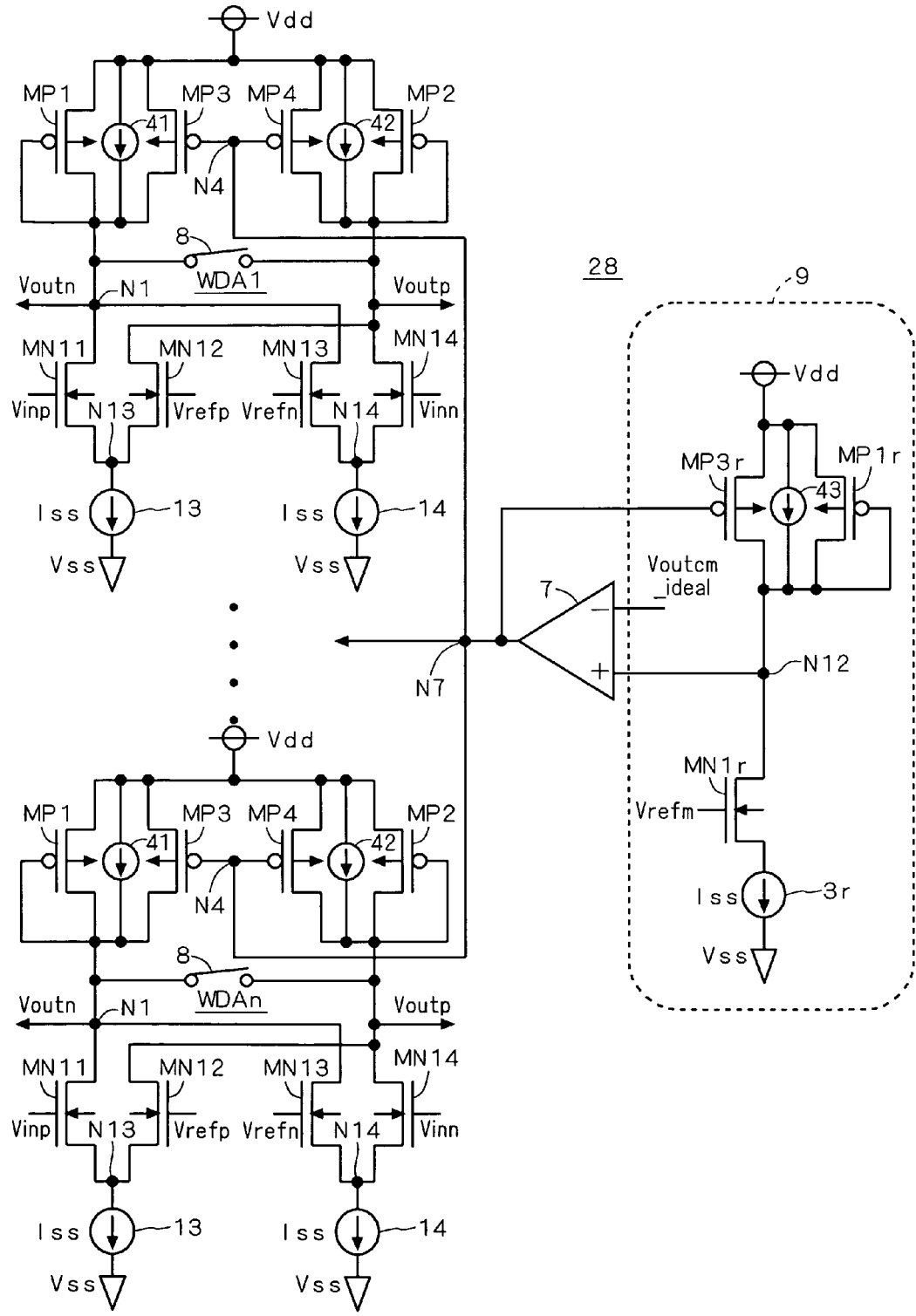
FIG. 12 is an explanatory view showing a schematic configuration of a differential amplifier circuit according to an eighth embodiment of the present invention.
Figure 13:
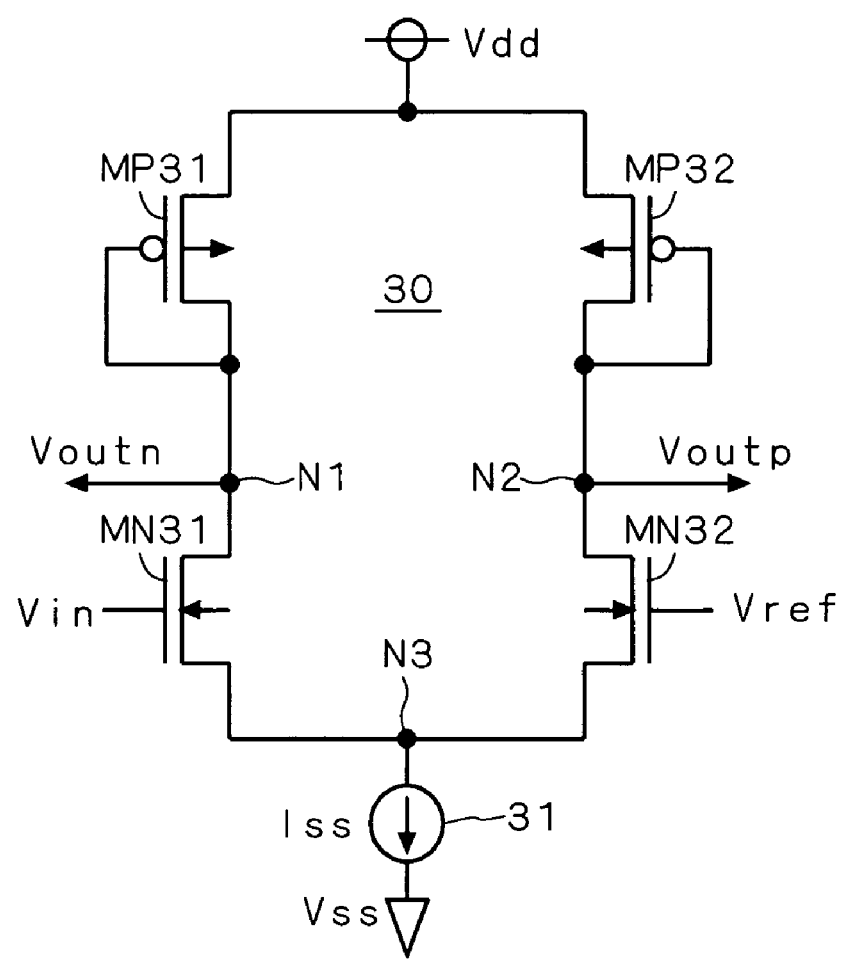
FIG. 13 is a circuit diagram showing a configuration of a conventional differential amplifier.

FIG. 12 is an explanatory view showing a configuration of a differential amplifier circuit according to an eighth embodiment of the present invention. As shown in the figure, a differential amplifier circuit 28 is configured by n (n≧2)

differential amplifier stages WDA1 to WDAn of four-input configuration, a replica circuit 9, and the comparator 7.

As shown in the figure, the differential amplifier circuit 28 of the eighth embodiment has, in each differential amplifier stage WDA1 to WDAn, a constant current source 41 arranged in parallel to the PMOS transistors MP1 and MP3 between the power supply voltage Vdd and the node N1, and a constant current source 42 arranged in parallel to the PMOS transistors MP1 and MP4 between the power supply voltage Vdd and the node N2. The constant current source 41 has a function of bypassing one part of the current flowing through the NMOS transistors MN11 and MN12 forming a differential pair. Similarly, the constant current source 42 has a function of bypassing one part of the current flowing through the NMOS transistors MN13 and MN14 forming a differential pair. Other configurations are the same as the fourth embodiment shown in FIG. 8, and thus the description thereof will be omitted.

The replica circuit 9 has a constant current source 43 arranged in parallel to the PMOS transistors MP1$r$ and MP3$r$ between the power supply voltage Vdd and the node N12. The constant current source 43 has a function of bypassing the current amount flowing through the NMOS transistor MN1$r$. Other configurations are the same as the replica 6 of the fourth embodiment shown in FIG. 8, and thus the description thereof will be omitted.

The differential amplifier circuit 28 of the eighth embodiment has advantages similar to the differential amplifier circuit 23 of the third embodiment, and also has the following advantages.

The differential amplifier circuit 28 of the eighth embodiment bypasses one part of the current flowing to the differential pair of each differential amplifier stage WDA1 to WDAn by the added constant current sources 41, 42, so that the current flowing through the PMOS transistors MP3 and MP4 biased at the gate that become the load can be adjusted. That is, the current flowing through the differential pair can be set independent of the output resistance and the output common voltage Voutcm of the differential amplifier stage by adding the constant current sources 41, 42.

In the replica circuit 9 as well, the equivalence with the differential amplifier stages WDA1 to WDAn including the constant current sources 41, 42 can be maintained by arranging the constant current source 43 equivalent to the constant current sources 41, 42.

In the eighth embodiment, a configuration in which the constant current sources 41 to 43 are arranged in the differential amplifier circuit 25 of the fifth embodiment shown in FIG. 9 has been described, but it should be recognized that the constant current sources 41 to 43 may be similarly arranged in the differential amplifier circuits 21 to 24 of the first embodiment to the fourth embodiments, and the differential amplifier circuit 26 and the differential amplifier circuit 27 of the sixth embodiment and the seventh embodiment.

While the invention has been shown and described in detail, the foregoing description is in all aspects illustrative and not restrictive. It is therefore understood that numerous modifications and variations can be devised without departing from the scope of the invention.

What is claimed is:

1. A differential amplifier circuit comprising at least one differential amplifier, said at least one differential amplifier including:

first and second power supplies;

one and other differential transistors receiving one input signal and other input signal at a control electrode, respectively, and having respective one electrodes commonly connected;

a differential operation constant current source interposed between the one electrodes of said one and other differential transistors and said second power supply;

first and second loads having respective one ends commonly connected to said first power supply and other ends connected to first and second output parts, which are other electrodes of said one and other differential transistors, respectively, and contributing to an amplification degree of an input/output signal; and amplification degree adjustment units, arranged in correspondence to said first and second loads, which becomes a non-operation state when an input potential difference, which is a difference between said one input signal and said other input signal, is below a predetermined threshold value and does not influence said amplification degree, and which becomes an operation state when said input potential difference exceeds said predetermined threshold value and lowers said amplification degree.

2. The differential amplifier circuit according to claim 1, wherein said amplification degree adjustment units include first and second load transistors having respective one electrodes commonly connected to said first power supply and respectively having other electrode and a control electrode commonly connected, the other electrodes being connected to said first and second output parts, respectively, and said first and second loads include third and fourth load transistors each having respective one electrodes connected to said first power supply and other electrodes connected to said first and second output parts, respectively, said differential amplifier circuit further comprising:

an output common voltage control unit for outputting a control signal to the control electrodes of said third and fourth load transistors so that potentials of said first and second output parts become a reference output common voltage set in advance in time of in-phase input of said one input signal and said other input signal, wherein said reference output common voltage is set to a voltage said first and second load transistors are turned OFF in time of a balanced state in which said input potential difference is "0".

3. The differential amplifier circuit according to claim 2, wherein said at least one differential amplifier includes a plurality of differential amplifiers each including said one and other differential transistors and said first to fourth load transistors, and said output common voltage control unit is commonly used among said plurality of differential amplifiers.

4. The differential amplifier circuit according to claim 3, wherein said plurality of differential amplifiers are arranged in parallel in correspondence to a plurality of reference voltages set to different values in a step-wise manner, and receives a common input voltage at said one input signal and receives a corresponding reference voltage of said plurality of reference voltages at said other input signal, said differential amplifier circuit further comprising:

a plurality of averaging resistors arranged between said first output parts and between said second output parts at between the adjacent differential amplifiers of said plurality of differential amplifiers.

5. The differential amplifier circuit according to claim 2, wherein said one input signal includes a first one input signal and a second one input signal, and said other input signal includes a first other input signal and a second other input signal, said one differential transistor includes first and second one differential transistors, and said other differential transistor includes first and second other differential transistors, said differential operation constant current source includes first and second differential operation constant current sources, one electrode of said first one differential transistor and one electrode of said first other differential transistor are commonly connected, and one electrode of said second one differential transistor and one electrode of said second other differential transistor are commonly connected, other electrodes of said first and second one differential transistors are commonly connected to said first output part, and other electrodes of said first and second other differential transistors are commonly connected to said second output part, said first differential operation constant current source is interposed between the one electrodes of said first one and other differential transistors and said second power supply, and said second differential operation constant current source is interposed between the one electrodes of said second one and other differential transistors and said second power supply, and said first one differential transistor receives said first one input signal at a control electrode, said first other differential transistor receives said first other input signal at a control electrode, said second one differential transistor receives said second one input signal at a control signal, and said second other differential transistor receives said second other input signal at a control signal.

6. The differential amplifier circuit according to claim 2, said at least one differential amplifier further including:

a switch part arranged between said first and second output parts, for short circuiting said first and the second output parts in ON state, wherein said switch part is turned ON for a constant time at the beginning of an amplification period.

7. The differential amplifier circuit according to claim 2, further comprising:

a reference output common voltage generation circuit for generating said reference output common voltage, said reference output common voltage generation circuit including:

a predetermined load element for receiving a predetermined voltage at one end; and a constant current source for supplying a constant current to said predetermined load element, wherein said reference output common voltage is obtained from other end of said predetermined load element.

8. The differential amplifier circuit according to claim 2, further comprising:

a reference output common voltage generation circuit for generating said reference output common voltage, said reference output common voltage generation circuit including:

a series resistor group including a plurality of resistors arranged in series between first and second voltages different from each other, wherein said reference output common voltage is obtained from between a predetermined adjacent pair of resistors of said plurality of resistors.

9. The differential amplifier circuit according to claim 2, said output common voltage control unit including:

a first replica load transistor having one electrode connected to said first power supply and other electrode and a control electrode commonly connected, the other electrode being a replica output part;

a second replica load transistor having one electrode connected to said first power supply, and other electrode connected to said replica output part;

a replica differential transistor having other electrode connected to said replica output part, and receiving a replica reference voltage at a control electrode; and a replica operation constant current source arranged between one electrode of said replica differential transistor and said second power supply, wherein said first and second replica load transistors as well as said replica differential transistor are configured equivalent to said first and third load transistors as well as said one differential transistor, said output common voltage control unit further including:

a comparator for outputting a control signal to a control electrode of said second replica load transistor and the control electrodes of said third and fourth load transistors so that a potential obtained from said replica output part and said reference output common voltage match.

10. The differential amplifier circuit according to claim 9, said at least one differential amplifier further including:

a first load constant current source arranged between the one electrode and the other electrode of said first and the third load transistors; and a second load constant current source arranged between the one electrode and the other electrode of said second and the fourth load transistors, said output common voltage control unit further including:

a replica load current source arranged between the one electrode and the other electrode of said first and the second replica load transistors.

11. A differential amplifier circuit comprising at least one differential amplifier, said at least one differential amplifier including:

first and second power supplies;

one and other differential transistors receiving one input signal and other input signal at a control electrode, respectively, and having respective one electrodes commonly connected;

a differential operation constant current source interposed between the one electrodes of said one and other differential transistor and said second power supply;

first and second transistors having respective one electrodes commonly connected to said first power supply and respectively having an other electrode and a control electrode commonly connected, the other electrode being connected to first and second output parts;

third and fourth transistors having respective one electrodes commonly connected to said first power supply and respective other electrodes connected to said first and second output parts, respectively; and an output common voltage control unit for outputting a control signal to the control electrodes of said third and fourth transistors so that potentials of said first and the second output parts become a reference output common voltage set in advance in time of in-phase input of said one input signal and said other input signal, wherein said reference output common voltage is set to satisfy a reference condition in which an absolute value of a difference between a first power supply voltage supplied from said first power supply and said reference output common voltage is below a threshold voltage of said third and fourth transistors in time of a balanced state in which an input potential difference, which is a potential difference of said one input signal and said other input signal, is "0".

12. The differential amplifier circuit according to claim 11, said output common voltage control unit including:

a first replica transistor having one electrode connected to said first power supply and other electrode and a control electrode commonly connected, the other electrode being a replica output part;

a second replica transistor having one electrode connected to said first power supply, and other electrode connected to said replica output part;

a replica differential transistor having other electrode connected to said replica output part, and receiving a replica reference voltage at a control electrode; and a replica operation constant current source arranged between one electrode of said replica differential transistor and said second power supply, wherein said first and second replica transistors as well as said replica differential transistor are configured equivalent to said first and third transistors as well as said one differential transistor, said output common voltage control unit further including:

a comparator for outputting a control signal to a control electrode of said second replica transistor and the control electrodes of said third and fourth transistors so that a potential obtained from said replica output part and said reference output common voltage match.

13. An A/D converter comprising a differential amplifier circuit including at least one differential amplifier, said at least one differential amplifier including:

first and second power supplies;

one and other differential transistors receiving one input signal and other input signal at a control electrode, respectively, and having respective one electrodes commonly connected;

a differential operation constant current source interposed between the one electrodes of said one and other differential transistors and said second power supply;

first and second loads having respective one ends commonly connected to said first power supply and other ends connected to first and second output parts, which are other electrodes of said one and other differential transistors, respectively, and contributing to an amplification degree of an input/output signal; and amplification degree adjustment units, arranged in correspondence to said first and second loads, which becomes a non-operation state when an input potential difference, which is a difference between said one input signal and said other input signal, is below a predetermined threshold value and does not influence said amplification degree, and which becomes an operation state when said input potential difference exceeds said predetermined threshold value and lowers said amplification degree, wherein said one input signal and said other input signal include an analog input voltage, said A/D converter further comprising:

a digital signal generation unit for generating a digital signal based on an amplification result of said at least one differential amplifier.

14. An A/D converter comprising a differential amplifier circuit including at least one differential amplifier, said at least one differential amplifier including:

first and second power supplies;

one and other differential transistors receiving one input signal and other input signal at a control electrode, respectively, and having respective one electrodes commonly connected;

a differential operation constant current source interposed between the one electrodes of said one and other differential transistor and said second power supply;

first and second transistors having respective one electrodes commonly connected to said first power supply and respectively having an other electrode and a control electrode commonly connected, the other electrode being connected to first and second output parts;

third and fourth transistors having respective one electrodes commonly connected to said first power supply and respective other electrodes connected to said first and second output parts, respectively; and an output common voltage control unit for outputting a control signal to the control electrodes of said third and fourth transistors so that potentials of said first and second output parts become a reference output common voltage set in advance in time of in-phase input of said one input signal and said other input signal, wherein said reference output common voltage is set to satisfy a reference condition in which an absolute value of a difference between a first power supply voltage supplied from said first power supply and said reference output common voltage is below a threshold voltage of said third and fourth transistors in time of a balanced state in which an input potential difference, which is a potential difference of said one input signal and said other input signal, is "0", and said one input signal and said other input signal include an analog input voltage, said A/D converter further comprising:

a digital signal generation unit for generating a digital signal based on an amplification result of said at least one differential amplifier.

\* \* \* \* \*